(12) United States Patent
Feng et al.

(10) Patent No.: US 11,348,531 B2
(45) Date of Patent: May 31, 2022

(54) SHIFT REGISTER UNIT, GATE DRIVING CIRCUIT, DISPLAY PANEL AND DRIVING METHOD THEREOF

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/772,958

(22) PCT Filed: Nov. 5, 2019

(86) PCT No.: PCT/CN2019/115661
§ 371 (c)(1),
(2) Date: Jun. 15, 2020

(87) PCT Pub. No.: WO2020/108242
PCT Pub. Date: Jun. 4, 2020

(65) Prior Publication Data
US 2021/0166633 A1 Jun. 3, 2021

(30) Foreign Application Priority Data
Nov. 26, 2018 (CN) .......................... 201811417915.7

(51) Int. Cl.
G09G 3/3225 (2016.01)
G09G 3/3266 (2016.01)
G11C 19/28 (2006.01)

(52) U.S. Cl.
CPC ......... G09G 3/3266 (2013.01); G09G 3/3225 (2013.01); G11C 19/28 (2013.01);
(Continued)

(58) Field of Classification Search
CPC .......... G09G 3/3225–3266; G09G 2300/0426; G09G 2310/0286; G11C 19/28
See application file for complete search history.

(56) References Cited

U.S. PATENT DOCUMENTS

2008/0266275 A1  10/2008  Tsai et al.
2016/0125954 A1*  5/2016  Gu ....................... G09G 3/3688
377/64

FOREIGN PATENT DOCUMENTS

CN  102930812 A  2/2013
CN  104252851 A  * 12/2014  ........... G09G 3/3677
(Continued)

OTHER PUBLICATIONS

First Office Action dated Jan. 6, 2020 corresponding to Chinese application No. 201811417915.7.

*Primary Examiner* — Lin Li
(74) *Attorney, Agent, or Firm* — Nath, Goldberg & Meyer; Joshua B. Goldberg

(57) ABSTRACT

The present disclosure provides a shift register unit, including a detection signal input sub-circuit, a display signal input sub-circuit, an output circuit, a pull-down control circuit and a signal output terminal, the output circuit includes a pull-up sub-circuit and a pull-down sub-circuit, the pull-down control circuit includes a selection sub-circuit and a plurality of pull-down control sub-circuits. The present disclosure further provides a gate driving circuit, a display panel and a (Continued)

driving method for driving the display panel. The shift register unit has a simple structure and a long service life.

15 Claims, 6 Drawing Sheets

(52) U.S. Cl.
CPC ............... *G09G 2300/0426* (2013.01); *G09G 2310/0286* (2013.01)

(56) References Cited

FOREIGN PATENT DOCUMENTS

| | | | | |
|---|---|---|---|---|
| CN | 105118462 | A | 12/2015 | |
| CN | 105139825 | A | 12/2015 | |
| CN | 205028636 | U | 2/2016 | |
| CN | 105609138 | A * | 5/2016 | ............. G11C 19/28 |
| CN | 106157874 | A * | 11/2016 | ............. G11C 19/28 |
| CN | 108877627 | A | 11/2018 | |
| CN | 108877682 | A | 11/2018 | |
| CN | 109243371 | A * | 1/2019 | ........... G09G 3/3266 |
| CN | 109346007 | A | 2/2019 | |

* cited by examiner

SHIFT REGISTER UNIT, GATE DRIVING CIRCUIT, DISPLAY PANEL AND DRIVING METHOD THEREOF

CROSS-REFERENCE TO RELATED APPLICATIONS

This is a National Phase Application filed under 35 U.S.C. 371 as a national stage of PCT/CN2019/115661, filed Nov. 5, 2019, an application claiming the benefit of Chinese Application No. 201811417915.7, filed Nov. 26, 2018, the content of each of which is hereby incorporated by reference in its entirety.

TECHNICAL FIELD

The present disclosure relates to the field of display technology, and in particular, to a shift register unit, a gate driving circuit including the shift register unit, a display panel including the gate driving circuit, and a driving method for driving the display panel.

BACKGROUND

For an organic light emitting diode (OLED) display panel, a pixel circuit includes a driving transistor for driving an organic light emitting diode to emit light. Due to non-uniform manufacturing process, threshold voltages of driving transistors in different pixel units are not uniform, and therefore, the light emitting brightness of light emitting diodes in different pixel units of a single display panel is not uniform. In view of this, a compensation circuit is required.

A common compensation method is to compensate externally. In an externally compensated OLED display panel, it is necessary to provide not only scanning signals for pixel units of the display panel but also a scanning signal for a detection circuit, which results in a complex structure of a shift register for generating the scanning signals.

However, it is a market trend to make the display panel have a narrow bezel, and an excessively complex structure of the shift register is not favorable for realizing the display panel with the narrow bezel.

SUMMARY

As a first aspect of the present disclosure, there is provided a shift register unit including a signal input circuit, an output circuit, a pull-down control circuit, and a signal output terminal, the output circuit includes a pull-up sub-circuit and a pull-down sub-circuit, the signal input circuit is configured to provide signals to a pull-up control terminal of the pull-up sub-circuit at different periods, the pull-up sub-circuit is configured to output a scanning signal via the signal output terminal under control of a signal received by the pull-up control terminal of the pull-up sub-circuit; the pull-down sub-circuit includes a plurality of pull-down control terminals, and is configured to pull down a potential of the signal output terminal under control of a valid pull-down control signal received by at least one of the pull-down control terminals of the pull-down sub-circuit; the pull-down control circuit includes a selection sub-circuit and a plurality of pull-down control sub-circuits, the pull-down control sub-circuits correspond to the pull-down control terminals in a one-to-one mode, and the selection sub-circuit is configured to selectively configure one of the pull-down control sub-circuits to provide the valid pull-down control signal to a corresponding one of the pull-down control terminals.

In some implementations, the pull-down sub-circuit includes two pull-down control terminals, the pull-down control circuit includes a first pull-down control sub-circuit and a second pull-down control sub-circuit, the selection sub-circuit includes a selection transistor, and a gate electrode of the selection transistor is electrically coupled to a fifth clock signal terminal; the first pull-down control sub-circuit includes a first pull-down control transistor, a second pull-down control transistor and a third pull-down control transistor, a gate electrode and a first electrode of the first pull-down control transistor are electrically coupled to a corresponding fourth clock signal terminal, a second electrode of the first pull-down control transistor is electrically coupled to a first electrode of the third pull-down control transistor and one of the two pull-down control terminals of the pull-down sub-circuit, a gate electrode of the second pull-down control transistor is electrically coupled to the second electrode of the first pull-down control transistor, a second electrode of the second pull-down control transistor is directly or indirectly electrically coupled to a second level signal terminal, a first electrode of the second pull-down control transistor is electrically coupled to the pull-up control terminal of the pull-up sub-circuit, and a second electrode of the third pull-down control transistor is electrically coupled to the second level signal terminal, a gate electrode of the third pull-down control transistor is electrically coupled to the pull-up control terminal of the pull-up sub-circuit; the second pull-down control sub-circuit includes a fourth pull-down control transistor, a fifth pull-down control transistor and a sixth pull-down control transistor, a gate electrode and a first electrode of the fourth pull-down control transistor are electrically coupled to a corresponding fourth clock signal terminal, a second electrode of the fourth pull-down control transistor is electrically coupled to a first electrode of the sixth pull-down control transistor and the other one of the two pull-down control terminals of the pull-down sub-circuit, a gate electrode of the fifth pull-down control transistor is electrically coupled to the second electrode of the fourth pull-down control transistor, a second electrode of the fifth pull-down control transistor is directly or indirectly electrically coupled to the second level signal terminal, a first electrode of the fifth pull-down control transistor is electrically coupled to the pull-up control terminal of the pull-up sub-circuit, and a second electrode of the sixth pull-down control transistor is electrically coupled to the second level signal terminal, a gate electrode of the sixth pull-down control transistor is electrically coupled to the pull-up control terminal of the pull-up sub-circuit; a second electrode of the selection transistor is electrically coupled, directly or indirectly, to the second electrode of the first pull-down control transistor, and a first electrode of the selection transistor is electrically coupled, directly or indirectly, to the second electrode of the fourth pull-down control transistor.

In some implementations, the second electrode of the selection transistor is electrically coupled to the second electrode of the first pull-down control transistor through a first anti-interference transistor, and the first electrode of the selection transistor is electrically coupled to the second electrode of the fourth pull-down control transistor through a second anti-interference transistor; a gate electrode of the first anti-interference transistor and a second electrode of the first anti-interference transistor are electrically coupled to the second electrode of the first pull-down control transistor, and a first electrode of the first anti-interference transistor is electrically coupled to the second electrode of the selection transistor; a gate electrode of the second anti-interference transistor and a second electrode of the second anti-interference transistor are electrically coupled to the first electrode of the selection transistor, and a first electrode of the second anti-interference transistor is electrically coupled to the second electrode of the fourth pull-down control transistor.

In some implementations, the first pull-down control sub-circuit further includes a first anti-leakage transistor having a gate electrode electrically coupled to the gate electrode of the second pull-down control transistor, a first electrode electrically coupled to the second electrode of the second pull-down control transistor, and a second electrode electrically coupled to the second level signal terminal; the second pull-down control sub-circuit further includes a second anti-leakage transistor, a gate electrode of the second anti-leakage transistor is electrically coupled to the gate electrode of the fifth pull-down control transistor, the second electrode of the fifth pull-down control transistor is electrically coupled to a first electrode of the second anti-leakage transistor, and a second electrode of the second anti-leakage transistor is electrically coupled to the second level signal terminal.

In some implementations, the shift register unit further includes a reset circuit, an input terminal of the reset circuit is electrically coupled to the second level signal terminal, an output terminal of the reset circuit is electrically coupled to the pull-up control terminal of the pull-up sub-circuit, a control terminal of the reset circuit is electrically coupled to a first reset signal terminal, and the reset circuit is configured to control the input terminal of the reset circuit to be electrically coupled to or decoupled from the output terminal of the reset circuit according to a signal provided by the first reset signal terminal.

In some implementations, the reset circuit includes a first reset transistor, a second electrode of the first reset transistor is directly or indirectly electrically coupled to the second level signal terminal, and a first electrode of the first reset transistor is electrically coupled to the pull-up control terminal of the pull-up sub-circuit.

In some implementations, the reset circuit further includes a third anti-leakage transistor, a gate electrode of the third anti-leakage transistor is electrically coupled to a gate electrode of the first reset transistor, a first electrode of the third anti-leakage transistor is electrically coupled to the second electrode of the first reset transistor, and a second electrode of the third anti-leakage transistor is electrically coupled to the second level signal terminal.

In some implementations, the shift register unit further includes a noise reduction circuit, an input terminal of the noise reduction circuit is electrically coupled to the second level signal terminal, an output terminal of the noise reduction circuit is electrically coupled to the pull-up control terminal of the pull-up sub-circuit, a control terminal of the noise reduction circuit is electrically coupled to a noise reduction signal terminal, and the noise reduction circuit is configured to control the input terminal of the noise reduction circuit to be electrically coupled to or decoupled from the output terminal of the noise reduction circuit according to a signal received by the control terminal of the noise reduction circuit.

In some implementations, the noise reduction circuit includes a noise reduction transistor, a second electrode of the noise reduction transistor is electrically coupled, directly or indirectly, to the second level signal terminal, and a first electrode of the noise reduction transistor is electrically coupled to the control terminal of the pull-up sub-circuit.

In some implementations, the noise reduction circuit further includes a fourth anti-leakage transistor, a gate electrode of the fourth anti-leakage transistor is electrically coupled to the gate electrode of the noise reduction transistor, a first electrode of the fourth anti-leakage transistor is electrically coupled to the second electrode of the noise reduction transistor, and a second electrode of the fourth anti-leakage transistor is electrically coupled to the second level signal terminal.

In some implementations, the signal input circuit includes a detection signal input sub-circuit and a display signal input sub-circuit, the detection signal input sub-circuit is configured to provide a detection scanning control signal to the pull-up control terminal of the pull-up sub-circuit in a detection scanning signal output phase; the display signal input sub-circuit is configured to provide a display scanning control signal to the pull-up control terminal of the pull-up sub-circuit in a display scanning output phase.

In some implementations, the detection signal input sub-circuit includes a detection trigger signal input sub-circuit, a detection signal output sub-circuit, a switch sub-circuit, a detection signal reset sub-circuit, and a first storage sub-circuit, an output terminal of the detection trigger signal input sub-circuit is electrically coupled to a control terminal of the detection signal output sub-circuit, an input terminal of the detection trigger signal input sub-circuit is formed as an input terminal of the detection signal input sub-circuit, and the detection trigger signal input sub-circuit is configured to control the input terminal of the detection trigger signal input sub-circuit to be electrically coupled to or decoupled from the output terminal of the detection trigger signal input sub-circuit according to a signal received by the control terminal of the detection trigger signal input sub-circuit; an input terminal of the detection signal output sub-circuit is electrically coupled to a second clock signal terminal, an output terminal of the detection signal output sub-circuit is electrically coupled to an input terminal of the switch sub-circuit, and the detection signal output sub-circuit is configured to control the input terminal of the detection signal output sub-circuit to be electrically coupled to or decoupled from the output terminal of the detection signal output sub-circuit according to a signal received by the control terminal of the detection signal output sub-circuit; an output terminal of the switch sub-circuit is electrically coupled to the pull-up control terminal of the pull-up sub-circuit, and the switch sub-circuit is configured to control the input terminal of the switch sub-circuit to be electrically coupled to or decoupled from the output terminal of the switch sub-circuit according to a signal received by a control terminal of the switch sub-circuit; an input terminal of the detection signal reset sub-circuit is electrically coupled to the second level signal terminal, an output terminal of the detection signal reset sub-circuit is electrically coupled to the control terminal of the detection signal output sub-circuit, a control terminal of the detection signal reset sub-circuit is electrically coupled to a detection reset signal terminal, and the detection signal reset sub-circuit is configured to control the input terminal of the detection signal reset sub-circuit to be electrically coupled to or decoupled from the output terminal of the detection signal reset sub-circuit according to a signal received by the control terminal of the detection signal reset sub-circuit; and a first terminal of the first storage sub-circuit is electrically coupled to the control terminal of the detection signal output sub-circuit, and a second terminal of the first storage sub-circuit is electrically coupled to the second level signal terminal.

In some implementations, the detection trigger signal input sub-circuit includes a detection signal input transistor, a gate electrode of the detection signal input transistor is electrically coupled to a first clock signal terminal, a first electrode of the detection signal input transistor is formed as the input terminal of the detection signal input sub-circuit, and a second electrode of the detection signal input transistor is electrically coupled, directly or indirectly, to the control terminal of the detection signal output sub-circuit.

In some implementations, the detection trigger signal input sub-circuit further includes a fifth anti-leakage transistor, a gate electrode of the fifth anti-leakage transistor is electrically coupled to the gate electrode of the detection signal input transistor, a first electrode of the fifth anti-leakage transistor is electrically coupled to the second electrode of the detection signal input transistor, and a second electrode of the fifth anti-leakage transistor is electrically coupled to the control terminal of the detection signal output sub-circuit.

In some implementations, the detection signal reset sub-circuit includes a second reset transistor, a first electrode of the second reset transistor is electrically coupled to the output terminal of the detection signal input sub-circuit, a second electrode of the second reset transistor is directly or indirectly electrically coupled to the second level signal terminal, and a gate electrode of the second reset transistor is formed as the control terminal of the detection signal reset sub-circuit.

In some implementations, the detection signal reset sub-circuit further includes a sixth anti-leakage transistor, a gate electrode of the sixth anti-leakage transistor is electrically coupled to the gate electrode of the second reset transistor, a first electrode of the sixth anti-leakage transistor is electrically coupled to the second electrode of the second reset transistor, and a second electrode of the sixth anti-leakage transistor is electrically coupled to the second level signal terminal.

In some implementations, the switch sub-circuit includes a switch transistor, a gate electrode of the switch transistor is formed as the control terminal of the switch sub-circuit, a first electrode of the switch transistor is formed as the input terminal of the switch sub-circuit, and a second electrode of the switch transistor is directly or indirectly electrically coupled to the control terminal of the pull-up sub-circuit.

In some implementations, the switch sub-circuit further includes a seventh anti-leakage transistor, a gate electrode of the seventh anti-leakage transistor is electrically coupled to the gate electrode of the switch transistor, a first electrode of the seventh anti-leakage transistor is electrically coupled to the second electrode of the switch transistor, and the second electrode of the seventh anti-leakage transistor is electrically coupled to the control terminal of the pull-up sub-circuit.

In some implementations, the shift register unit further includes a noise reduction circuit, the noise reduction circuit includes a noise reduction transistor and a fourth anti-leakage transistor, a first electrode of the fourth anti-leakage transistor is electrically coupled to a second electrode of the noise reduction transistor, a second electrode of the fourth anti-leakage transistor is electrically coupled to the second level signal terminal, and a first electrode of the noise reduction transistor is electrically coupled to the control terminal of the pull-up sub-circuit; the shift register unit further includes an eighth anti-leakage transistor and a ninth anti-leakage transistor, the detection trigger signal input sub-circuit includes a detection signal input transistor and a fifth anti-leakage transistor, a gate electrode of the detection signal input transistor is electrically coupled to the first clock signal terminal, a first electrode of the detection signal input transistor is formed as the input terminal of the detection signal input sub-circuit, a second electrode of the detection signal input transistor is electrically coupled to a first electrode of the fifth anti-leakage transistor, a second electrode of the fifth anti-leakage transistor is electrically coupled to the input terminal of the detection signal reset sub-circuit, and a gate electrode of the fifth anti-leakage transistor is electrically coupled to the gate electrode of the detection signal input transistor; the detection signal reset sub-circuit includes a second reset transistor and a sixth anti-leakage transistor, a first electrode of the second reset transistor is electrically coupled to the output terminal of the detection signal input sub-circuit, a second electrode of the second reset transistor is electrically coupled to a first electrode of the sixth anti-leakage transistor, a gate electrode of the second reset transistor is formed as the control terminal of the detection signal reset sub-circuit, a gate electrode of the sixth anti-leakage transistor is electrically coupled to the gate electrode of the second reset transistor, and a second electrode of the sixth anti-leakage transistor is electrically coupled to the second level signal terminal; the switch sub-circuit further includes a seventh anti-leakage transistor, a gate electrode of the seventh anti-leakage transistor is electrically coupled to the gate electrode of the switch transistor, a first electrode of the seventh anti-leakage transistor is electrically coupled to the second electrode of the switch transistor, and a second electrode of the seventh anti-leakage transistor is electrically coupled to the control terminal of the pull-up sub-circuit; a gate electrode of the eighth anti-leakage transistor is electrically coupled to the output terminal of the detection signal input sub-circuit, a first electrode of the eighth anti-leakage transistor is electrically coupled to the second electrode of the detection signal input transistor, and a second electrode of the eighth anti-leakage transistor is electrically coupled to the input terminal of the display signal input sub-circuit; a gate electrode of the ninth anti-leakage transistor is electrically coupled to the control terminal of the pull-up sub-circuit, a first electrode of the ninth anti-leakage transistor is electrically coupled to the input terminal of the display signal input sub-circuit, and a second electrode of the ninth anti-leakage transistor is electrically coupled to the output terminal of the noise reduction circuit.

In some implementations, the output circuit includes a cascade output sub-circuit and at least one scanning signal output sub-circuit, the pull-up sub-circuit includes a cascade pull-up sub-circuit and a scanning signal output pull-up sub-circuit, a control terminal of the cascade pull-up sub-circuit is electrically coupled to a control terminal of the scanning signal output pull-up sub-circuit and is formed as the control terminal of the pull-up sub-circuit; the signal output terminal includes a cascade signal output terminal of the cascade output sub-circuit and a scanning signal output terminal of the scanning signal output sub-circuit; the pull-down sub-circuit includes a cascade pull-down sub-circuit and a scanning signal output pull-down sub-circuit, a control terminal of the cascade pull-down sub-circuit is electrically coupled to a control terminal of the scanning signal output pull-down sub-circuit and is formed as the control terminal of the pull-down sub-circuit; an output terminal of the scanning signal output pull-up sub-circuit is electrically coupled to the corresponding scanning signal output terminal, an output terminal of the scanning signal output pull-down sub-circuit is electrically coupled to the corresponding scanning signal output terminal, an output terminal of the cascade pull-down sub-circuit is electrically coupled to the cascade signal output terminal, and an output terminal of the cascade pull-up sub-circuit is electrically coupled to the cascade signal output terminal.

In some implementations, the cascade pull-up sub-circuit includes a cascade pull-up transistor and a storage capacitor, each scanning signal output pull-up sub-circuit includes a scanning signal output pull-up transistor, a gate electrode of the cascade pull-up transistor is formed as the pull-up control terminal of the pull-up sub-circuit, a first electrode of the cascade pull-up transistor is formed as an input terminal of the cascade pull-up sub-circuit, a second electrode of the cascade pull-up transistor is formed as the output terminal of the cascade pull-up sub-circuit, one terminal of the storage capacitor is electrically coupled to the gate electrode of the cascade pull-up transistor, and the other terminal of the storage capacitor is electrically coupled to the second electrode of the cascade pull-up transistor; and a gate electrode of the scanning signal output pull-up transistor is electrically coupled to the gate electrode of the cascade pull-up transistor, a first electrode of the scanning signal output pull-up transistor is formed as an input terminal of the scanning signal output pull-up sub-circuit, and a second electrode of the scanning signal output pull-up transistor is formed as the output terminal of the scanning signal output pull-up sub-circuit.

In some implementations, the cascade pull-down sub-circuit includes a plurality of cascade pull-down transistors, and the number of the cascade pull-down transistors is the same as the number of the control terminals of the pull-down sub-circuit and the cascade pull-down transistors correspond to the control terminals of the pull-down sub-circuit in a one-to-one mode, the scanning signal output pull-down sub-circuit includes a plurality of scanning signal output pull-down transistors, and the number of the scanning signal pull-down output transistors is the same as the number of the control terminals of the pull-down sub-circuit and the scanning signal pull-down output transistors correspond to the control terminals of the pull-down sub-circuit in a one-to-one mode; gate electrodes of the cascade pull-down transistors are respectively formed as the pull-down control terminals of the pull-down sub-circuit, first electrodes of the cascade pull-down transistors are formed as the input terminal of the cascade pull-down sub-circuit, and second electrodes of the cascade pull-down transistors are formed as the output terminal of the cascade pull-down sub-circuit; gate electrodes of the scanning signal output pull-down transistors are respectively electrically coupled to corresponding pull-down control terminals of the pull-down sub-circuit, first electrodes of the scanning signal output pull-down transistors are formed as the input terminal of the scanning signal pull-down output sub-circuit, and second electrodes of the scanning signal output pull-down transistors are formed as the output terminal of the scanning signal pull-down output sub-circuit.

As a second aspect of the present disclosure, there is provided a gate driving circuit including at least one shift register unit group, each shift register unit group includes a plurality of shift register units coupled in cascade, and at least one of the shift register units is the shift register unit provided in the present disclosure.

In some implementations, the gate driving circuit includes M shift register unit groups, the first M stages of shift register units of the gate driving circuit are respectively shift register units at a first stage of the M shift register unit groups, and the $n^{th}$ stage of shift register unit is cascaded with the $(n-M)^{th}$ stage of shift register unit, where M is a constant value and is a natural number not less than 1, n is a variable, and n is a natural number not less than M.

As a third aspect of the present disclosure, there is provided a display panel including a gate driving circuit, the gate driving circuit is the above gate driving circuit provided by the present disclosure, the signal input circuit of the shift register unit of the gate driving circuit includes a detection signal input sub-circuit and a display signal input sub-circuit, in a single stage of shift register unit, the output terminal of the detection signal input sub-circuit is electrically coupled to the control terminal of the pull-up sub-circuit, the first control terminal of the detection signal input sub-circuit is electrically coupled to the first clock signal terminal, the second control terminal of the detection signal input sub-circuit is electrically coupled to the second clock signal terminal, so that the detection signal input sub-circuit provides a detection scanning control signal to the control terminal of the pull-up sub-circuit under control of a first clock signal input through the first clock signal terminal and a second clock signal input through the second clock signal input terminal; the output terminal of the display signal input sub-circuit is electrically coupled to the control terminal of the pull-up sub-circuit, the input terminal of the display signal input sub-circuit is electrically coupled to a first level signal terminal, and the output terminal of the display signal input sub-circuit provides a display scanning control signal to the control terminal of the pull-up sub-circuit under control of a signal received by the control terminal of the display signal input sub-circuit.

As a fourth aspect of the present disclosure, there is provided a driving method for driving a display panel, the display panel being the above display panel provided by the present disclosure, the driving method including a plurality of frame periods, each of the frame periods including a display scanning signal output phase and a detection scanning signal output phase, the driving method including: controlling one of the pull-down control sub-circuits through the selection sub-circuit to provide a signal to the pull-down control terminal of the pull-down sub-circuit; in the display scanning signal output phase of each frame period, providing a display trigger signal to the control terminal of the display signal input sub-circuit in the first stage of shift register unit of each shift register unit group, so as to provide a signal to the pull-up control terminal of the pull-up sub-circuit by using the display signal input sub-circuit; in the display scanning signal output phase of the first frame period, providing a detection initial signal to the input terminal of the detection signal input sub-circuit in the first stage of shift register unit of each shift register unit group, so as to provide a signal for the pull-up control terminal of the pull-up sub-circuit by using the detection signal input sub-circuit, and in different frame periods, respectively controlling detection signal input sub-circuits in different stages of shift register units to output, so that in a predetermined number of frame periods, each of the shift register units outputs a valid signal to the pull-up control terminal of the pull-up sub-circuit in the detection scanning signal output phase.

DESCRIPTION OF DRAWINGS

The accompanying drawings, which are included to provide a further understanding of the present disclosure, constitute a part of the specification, and illustrate the present disclosure together with the following embodiments, but do not constitute a limitation to the present disclosure. In the drawings.

DESCRIPTION OF EMBODIMENTS

The specific embodiments of the present disclosure will be described in detail below in combination with the accompanying drawings. It should be understood that the specific embodiments described herein are only used to illustrate and interpret the disclosure and are not used to limit the disclosure.

Figure 1:
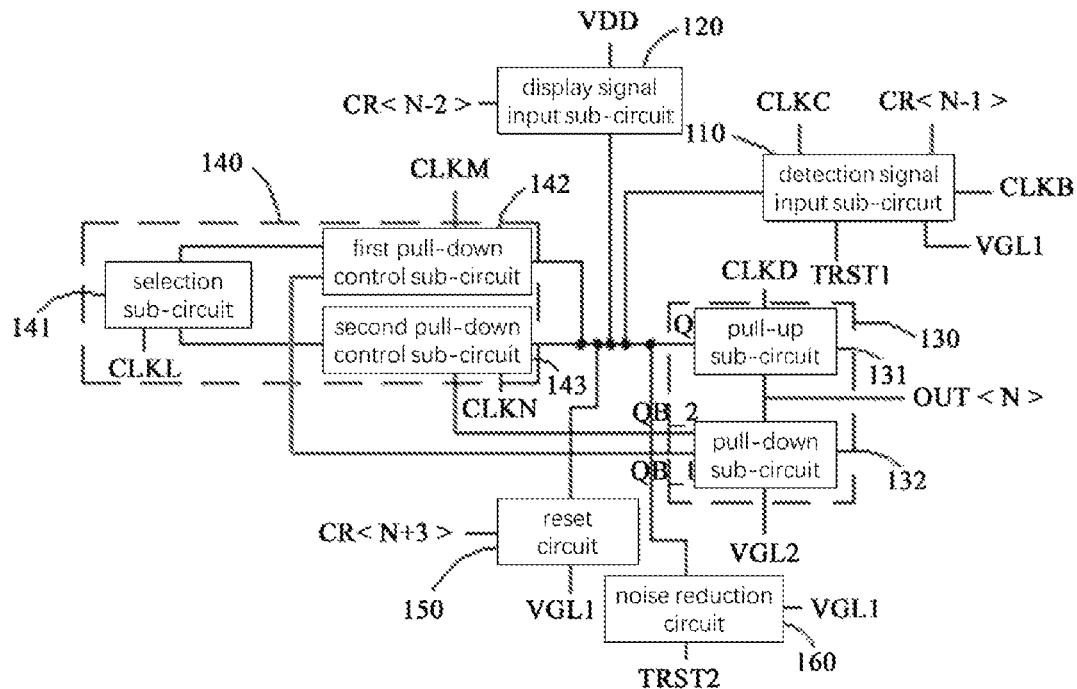
FIG. 1 is a schematic block diagram of a shift register unit provided by the present disclosure.

As a first aspect of the present disclosure, there is provided a shift register unit, as shown in FIG. 1, including a signal input circuit, an output circuit 130, a pull-down control circuit 140, and a signal output terminal OUT<N>. The output circuit 130 includes a pull-up sub-circuit 131 and a pull-down sub-circuit 132.

An output terminal of the signal input circuit is electrically coupled to a pull-up control terminal Q of the pull-up sub-circuit 131, and is configured to provide signals to the pull-up control terminal Q of the pull-up sub-circuit 131 at different time periods.

The pull-up sub-circuit 131 is configured to output a scanning signal via the signal output terminal OUT<N> under control of a signal received by the pull-up control terminal Q of the pull-up sub-circuit 131.

The pull-down sub-circuit 132 includes a plurality of pull-down control terminals, and the pull-down sub-circuit 132 is configured to pull down a potential of the signal output terminal OUT<N> under control of a valid pull-down control signal received by any one or any several pull-down control terminals of the pull-down sub-circuit 132.

The pull-down control circuit 140 includes a selection sub-circuit 141 and a plurality of pull-down control sub-circuits, the pull-down control sub-circuits correspond to the pull-down control terminals in a one-to-one correspondence, and the selection sub-circuit 141 is configured to selectively configure one of the pull-down control sub-circuits to provide the valid pull-down control signal to a corresponding one of the pull-down control terminals.

In the shift register unit, the signal input circuit may include a plurality of signal input sub-circuits, the output circuit 130 and the pull-down control circuit 140 may be shared by the signal input sub-circuits, and the signal input sub-circuits output a signal to the pull-up control terminal Q of the pull-up sub-circuit 131 by turns, and a waveform of a signal output by the signal output terminal OUT<N> is a superposition of waveforms input by the signal input sub-circuits.

It will be readily understood that each signal input sub-circuit is cascaded with a corresponding signal input sub-circuit in a shift register unit of a previous stage.

In the present disclosure, the pull-up sub-circuit 131 outputs different scanning signals under control of signals output by different ones of the signal input sub-circuits.

Since the pull-down sub-circuit 132 includes the plurality of pull-down control terminals, and the pull-down control sub-circuits provide pull-down control signals for the pull-down sub-circuit 132 in turn, it is possible to avoid electric leakage due to a thin film transistor being in a bias state for a long time, which is caused by "providing a pull-down control signal for a single pull-down control terminal of a pull-down sub-circuit by using a single pull-down control sub-circuit" in the related art, and further to prolong a service life of the shift register unit.

FIG. 1 illustrates an embodiment of the shift register unit provided by the present disclosure, in which it is shown how the various sub-circuits are controlled.

An input terminal of the pull-up sub-circuit 131 is electrically coupled to a third clock signal terminal CLKD, an output terminal of the pull-up sub-circuit 131 is electrically coupled to the signal output terminal, and the pull-up sub-circuit 131 is configured to control the input terminal of the pull-up sub-circuit 131 to be electrically coupled to or decoupled from the output terminal of the pull-up sub-circuit 131 under control of the signal received by the pull-up control terminal Q of the pull-up sub-circuit 131.

The signal received by the pull-up control terminal Q of the pull-up sub-circuit 131 is a signal processed by the signal input sub-circuit, in other words, the signal input sub-circuit can control the timing of the pull-up sub-circuit 131 outputting a third clock signal provided by the third clock signal terminal CLKD.

When the pull-up control terminal Q of the pull-up sub-circuit 131 receives a high level signal, the input terminal of the pull-up sub-circuit 131 is electrically coupled to the output terminal of the pull-up sub-circuit 131; alternatively, when the pull-up control terminal Q of the pull-up sub-circuit 131 receives a low level signal, the input terminal of the pull-up sub-circuit 131 is electrically decoupled from the output terminal of the pull-up sub-circuit 131.

The input terminal of the pull-down sub-circuit 132 is electrically coupled to a third level signal terminal VGL2, the output terminal of the pull-down sub-circuit 132 is electrically coupled to the signal output terminal, and the pull-down sub-circuit 132 has a plurality of pull-down control terminals. In the embodiment shown in FIG. 1, the pull-down sub-circuit 132 has two pull-down control terminals QB_1 and QB_2, but the present disclosure is not limited thereto, and the pull-down sub-circuit 132 may have more pull-down control terminals as needed.

The pull-down control circuit 140 includes a selection sub-circuit 141 and a plurality of pull-down control sub-circuits. In the embodiment shown in FIG. 1, the pull-down control circuit 140 includes two pull-down control sub-circuits, which are a first pull-down control sub-circuit 142 and a second pull-down control sub-circuit 143, respectively. First input terminals of the pull-down control sub-circuits are electrically coupled to a second level signal terminal VGL1, and output terminals of the pull-down control sub-circuits are electrically coupled to the pull-down control terminals of the pull-down sub-circuit 132 in a one-to-one correspondence. For example, in the embodiment shown in FIG. 1, the output terminal of the first pull-down control sub-circuit 142 is electrically coupled to the pull-down control terminal QB_1, and the output terminal of the second pull-down control sub-circuit 143 is electrically coupled to the pull-down control terminal QB_2. Second input terminals of the pull-down control sub-circuits are electrically coupled to multiple fourth clock signal terminals in a one-to-one correspondence. In the embodiment shown in FIG. 1, the second input terminal of the first pull-down control sub-circuit 142 is electrically coupled to the fourth clock signal terminal CLKM, and the second input terminal of the second pull-down control sub-circuit 142 is electrically coupled to the fourth clock signal terminal CLKN.

A control terminal of the selection sub-circuit 141 is electrically coupled to a fifth clock signal terminal CLKL, and the selection sub-circuit 141 can control a signal input from the input terminal of one of the pull-down control sub-circuits to enter the pull-down control sub-circuit under control of a fifth clock signal input through the fifth clock signal terminal CLKL.

In this embodiment, the signal output from the signal output terminal is the third clock signal input through the third clock signal terminal CLKD.

The pull-up sub-circuit 131 outputs different scanning signals under control of signals output by different signal input sub-circuits.

Since the pull-down sub-circuit 132 includes the plurality of pull-down control terminals, and the pull-down control signals are provided to the pull-down sub-circuit 132 by the pull-down control sub-circuits in turn, it is possible to avoid electric leakage due to a thin film transistor being in a bias state for a long time, which is caused by "providing a pull-down control signal to a single pull-down control terminal of a pull-down sub-circuit by using a single pull-down control sub-circuit" in the related art, and further to prolong a service life of the shift register unit.

It should be noted that the fourth clock signal input through the fourth clock signal terminal is a constant voltage signal. And, only when any pull-down control sub-circuit is operating, a valid fourth clock signal is provided to the fourth clock signal terminal corresponding to such pull-down control sub-circuit. That is to say, when the shift register unit operates, only one fourth clock signal terminal can receive the fourth clock signal, and none of the remaining clock signal terminals can receive the fourth clock signal.

In the present disclosure, there is no particular requirement on a specific type of the plurality of signal input sub-circuits, and as an implementation, the shift register unit may be configured to output a detection scanning signal and a display scanning signal, and accordingly, the plurality of signal input sub-circuits may include a detection signal input sub-circuit 110 and a display signal input sub-circuit 120.

An output terminal of the detection signal input sub-circuit 110 is electrically coupled to the pull-up control terminal Q of the pull-up sub-circuit 131, a first control terminal of the detection signal input sub-circuit 110 is electrically coupled to a first clock signal terminal CLKB, and a second control terminal of the detection signal input sub-circuit 110 is electrically coupled to a second clock signal terminal CLKC, so that the detection signal input sub-circuit 110 provides a detection scanning control signal to the pull-up control terminal Q of the pull-up sub-circuit 131 under control of a first clock signal input through the first clock signal terminal CLKB and a second clock signal input through the second clock signal terminal CLKC.

An output terminal of the display signal input sub-circuit 120 is electrically coupled to the pull-up control terminal Q of the pull-up sub-circuit 131, an input terminal of the display signal input sub-circuit 120 is electrically coupled to a first level signal terminal VDD, and the input terminal of the display signal input sub-circuit 120 and the output terminal of the display signal input sub-circuit 120 are configured to provide a display scanning control signal to the pull-up control terminal Q of the pull-up sub-circuit 131 under control of a signal received at a control terminal of the display signal input sub-circuit 120.

It should be noted that the detection signal input sub-circuit 110 and the display signal input sub-circuit 120 are configured to alternately provide signals to the pull-up control terminal Q of the pull-up sub-circuit 131.

An output state of the detection signal input sub-circuit 110 is controlled by three signals: the first clock signal input through the first clock signal terminal CLKB, the second clock signal input through the second clock signal terminal CLKC, and a signal input through an input terminal of the detection signal input sub-circuit 110. The signal input through the input terminal of the detection signal input sub-circuit 110 is an output signal of the previous stage of shift register unit cascaded with the current shift register unit.

An output state of the display signal input sub-circuit 120 is controlled only by a state of the signal received at the control terminal of the display signal input sub-circuit 120. As an implementation, the control terminal of the display signal input sub-circuit 120 may receive the signal output by the previous stage of shift register unit cascaded with the current shift register unit. As another implementation of the present disclosure, a sixth clock signal CLKA may further be used to control the input terminal of the display signal input sub-circuit 120 to be electrically coupled to or decoupled from the output terminal of the display signal input sub-circuit 120.

The pull-up sub-circuit 131 outputs the detection scanning signal under control of the detection scanning control signal.

The pull-up sub-circuit 131 outputs the display scanning signal under control of the display scanning control signal.

In the present disclosure, the pull-down control circuit 140 is not particularly limited to a specific structure. In the embodiment shown in FIG. 1, the pull-down sub-circuit 132 includes two pull-down control terminals, i.e., the pull-down control terminal QB_1 and the pull-down control terminal QB_2, and accordingly, the pull-down control circuit 140 includes two pull-down control sub-circuits, which are the first pull-down control sub-circuit 142 and the second pull-down control sub-circuit 143, respectively. The first pull-down control sub-circuit 142 corresponds to the pull-down control terminal QB_1, and the second pull-down control sub-circuit 143 corresponds to the pull-down control terminal QB_2.

The selection sub-circuit 141 is also not particularly limited to a specific structure. In the particular implementation shown in FIG. 2, the selection sub-circuit 141 includes a selection transistor M19, and a gate electrode of the selection transistor M19 is electrically coupled to the fifth clock signal terminal CLKL. First and second electrodes of the selection transistor M19 are electrically coupled to or decoupled from each other according to a signal received by the gate electrode of the selection transistor M19. For example, when the selection transistor M19 is an N-type transistor, the first electrode of the selection transistor M19 and the second electrode of the selection transistor M19 are electrically coupled to each other in response to that the gate electrode of the selection transistor M19 receives a high level signal; when the selection transistor M19 is a P-type transistor, the first electrode of the selection transistor M19 and the second electrode of the selection transistor M19 are electrically coupled to or decoupled from each other in response to that the gate electrode of the selection transistor M19 receives a low level signal.

Accordingly, the first pull-down control sub-circuit 142 may include a first pull-down control transistor M8, a second pull-down control transistor M9, and a third pull-down control transistor M10.

A gate electrode and a first electrode of the first pull-down control transistor M8 are electrically coupled to the corresponding fourth clock signal terminal CLKM, and a second electrode of the first pull-down control transistor M8 is electrically coupled to a first electrode of the third pull-down control transistor M10 and one of the two pull-down control terminals of the pull-down sub-circuit 132. In the particular implementation shown in FIG. 2, the second electrode of the first pull-down control transistor M8 is electrically coupled to the first electrode of the third pull-down control transistor M10 and the pull-down control terminal QB_1.

A gate electrode of the second pull-down control transistor M9 is electrically coupled to the second electrode of the first pull-down control transistor M8, a second electrode of the second pull-down control transistor M9 is electrically coupled to the second level signal terminal VGL1 directly or indirectly, and a first electrode of the second pull-down control transistor M9 is electrically coupled to the pull-up control terminal Q of the pull-up sub-circuit 131.

A second electrode of the third pull-down control transistor M10 is electrically coupled to the second level signal terminal VGL1, and a gate electrode of the third pull-down control transistor M10 is electrically coupled to the pull-up control terminal Q of the pull-up sub-circuit 131.

The first and third pull-down control transistors M8 and M10 may implement a resistive voltage division, in particular, the third pull-down control transistor M10 has a larger resistance than the first pull-down control transistor M8. When the pull-up control terminal Q of the pull-up sub-circuit 131 and the signal output terminal are pulled down by the first pull-down control sub-circuit 142, the first pull-down control sub-circuit 142 outputs a high level signal, i.e., the gate electrode of the second pull-down control transistor M9 should be provide with a high level signal. Since the third pull-down control transistor M10 has a resistance greater than that of the first pull-down control transistor M8, a potential of the gate electrode of the second pull-down control transistor M9 is not pulled down when both the first pull-down control transistor M8 and the third pull-down control transistor M10 are turned on.

Accordingly, the second pull-down control sub-circuit 143 includes a fourth pull-down control transistor M11, a fifth pull-down control transistor M12, and a sixth pull-down control transistor M13.

Figure 2:
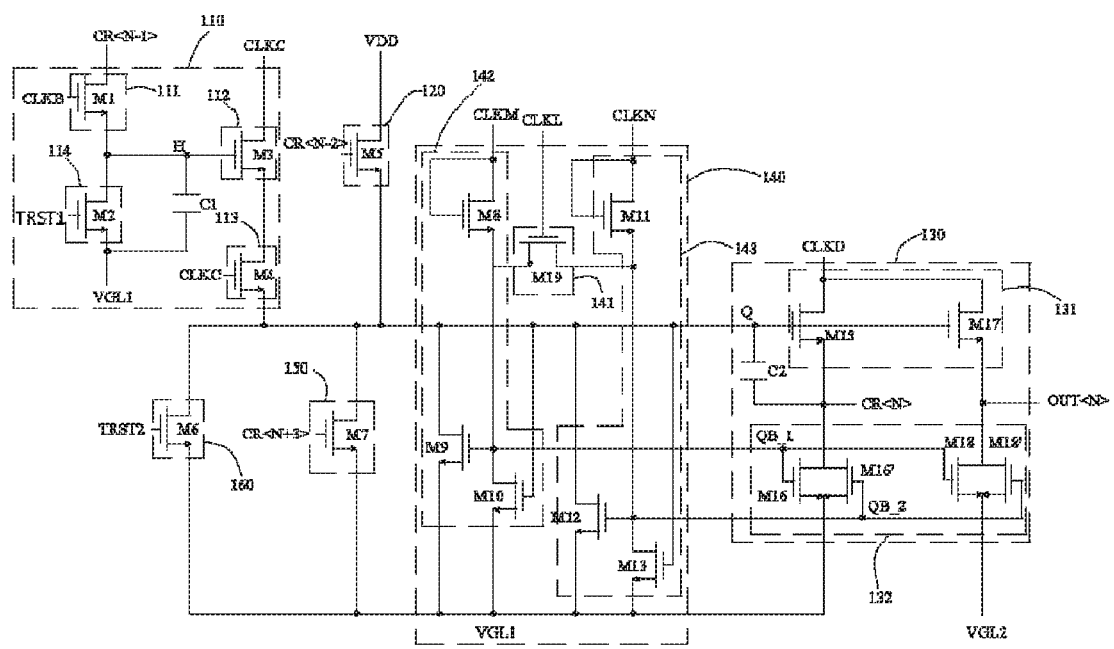
FIG. 2 is a schematic circuit diagram of a shift register unit provided by the present disclosure.

A gate electrode and a first electrode of the fourth pull-down control transistor M11 are electrically coupled to the corresponding fourth clock signal terminal CLKN, a second electrode of the fourth pull-down control transistor M11 is electrically coupled to a first electrode of the sixth pull-down control transistor M13 and the other one of the two control terminals of the pull-down sub-circuit 132, and in the implementation shown in FIG. 2, the second electrode of the fourth pull-down control transistor M11 is electrically coupled to the first electrode of the sixth pull-down control transistor M13 and the pull-down control terminal QB_1.

A gate electrode of the fifth pull-down control transistor M12 is electrically coupled to the second electrode of the fourth pull-down control transistor M11, a second electrode of the fifth pull-down control transistor M12 is electrically coupled to the second level signal terminal VGL1 directly or indirectly, and a first electrode of the fifth pull-down control transistor M12 is electrically coupled to the pull-up control terminal Q of the pull-up sub-circuit 131.

A second electrode of the sixth pull-down control transistor M13 is electrically coupled to the second level signal terminal VGL1, and a gate electrode of the sixth pull-down control transistor M13 is electrically coupled to the pull-up control terminal Q of the pull-up sub-circuit 131.

The second electrode of the selection transistor M19 is electrically coupled, directly or indirectly, to the second electrode of the first pull-down control transistor M8, and the first electrode of the selection transistor M19 is electrically coupled, directly or indirectly, to the second electrode of the fourth pull-down control transistor M11.

Likewise, the sixth pull-down control transistor M13 has a resistance greater than that of the fourth pull-down control transistor M11.

Figure 3:
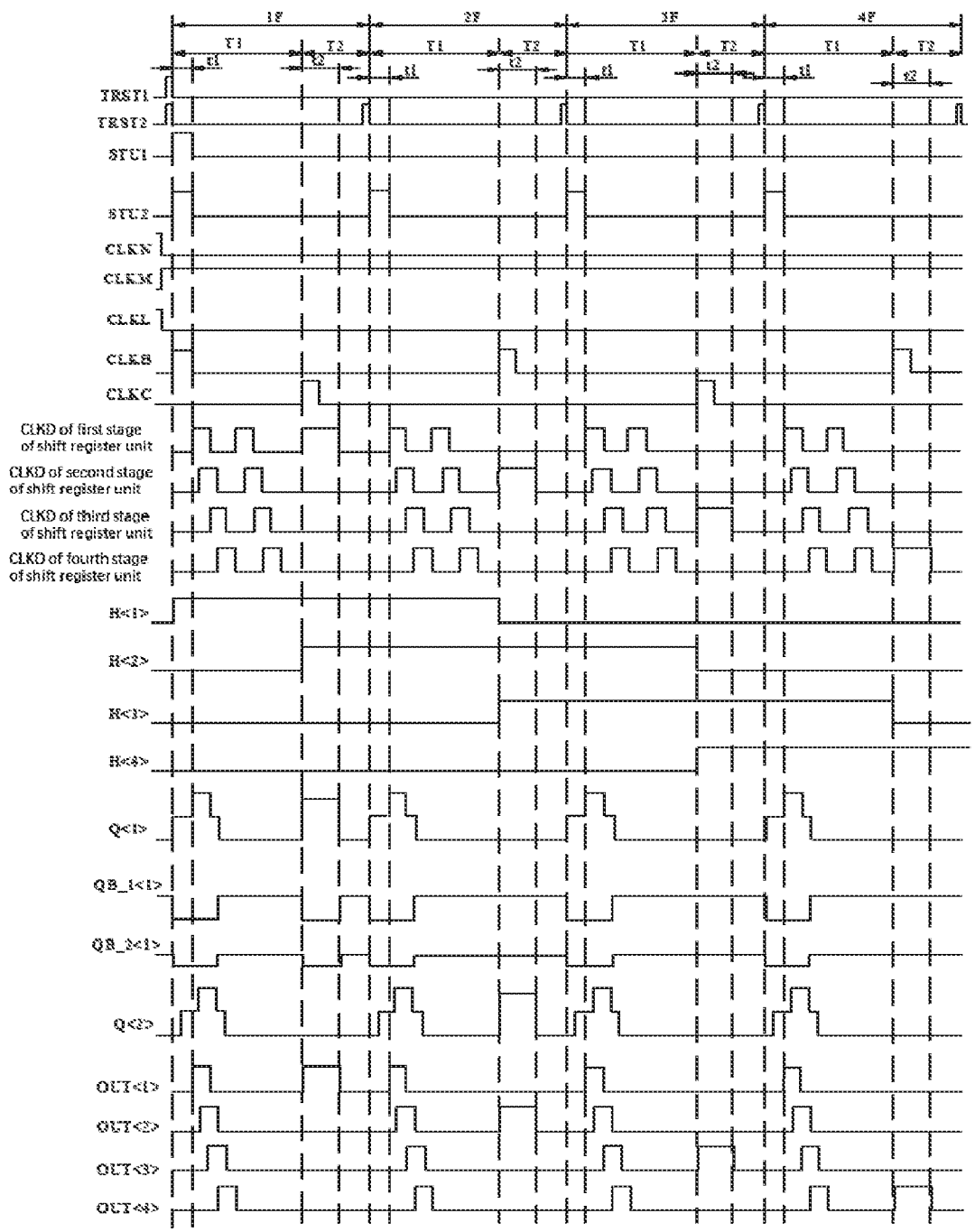
FIG. 3 is a signal timing diagram when a gate driving circuit including the shift register unit shown in FIG. 2 is driven to operate.

When the first pull-down control sub-circuit 142 operates normally, a valid fourth clock signal is supplied to the fourth clock signal terminal CLKM coupled to the first pull-down control transistor M8, the valid fourth clock signal is a high level signal in FIG. 3, an invalid fourth clock signal is supplied to the fourth clock signal terminal CLKN coupled to the fourth pull-down control transistor M11, and the invalid fourth clock signal is a low level signal in FIG. 3.

When the first pull-up control transistor M8 in the first pull-down control sub-circuit 142 fails under control of a long-term positive bias, the supply of the valid fourth clock signal to the fourth clock signal terminal CLKM coupled to the first pull-up control transistor M8 is stopped, and a valid fifth clock signal is started to be supplied to the fifth clock signal terminal CLKL, so that the first and second electrodes of the selection transistor M19 are electrically coupled to each other. At the same time, the fourth clock signal terminal CLKN coupled to the fourth pull-down control transistor M11 is provided with a valid fifth clock signal, so that the first and second electrodes of the fourth pull-down control transistor M11 are electrically coupled to each other.

Therefore, in the shift register unit provided by the present disclosure, the pull-down control circuit can be ensured to function all the time, so that the service life of the shift register unit can be prolonged.

In implementations shown in FIG. 2, and FIG. 4 through FIG. 8, the second electrode of the selection transistor M19 is directly electrically coupled to the second electrode of the first pull-down control transistor M8, and the first electrode of the selection transistor M19 is directly electrically coupled to the second electrode of the fourth pull-down control transistor M11.

Figure 9:
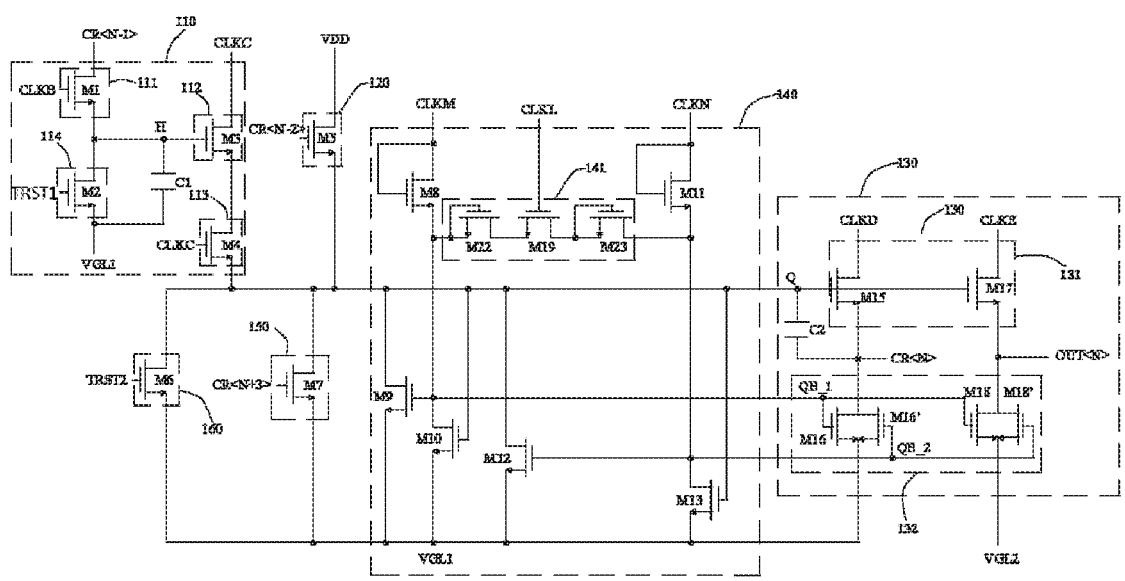
FIG. 9 is a schematic circuit diagram of a shift register unit provided by the present disclosure.

In the implementation shown in FIG. 9, the second electrode of the selection transistor M19 is indirectly electrically coupled to the second electrode of the first pull-down control transistor M8, and the first electrode of the selection transistor M19 is indirectly electrically coupled to the second electrode of the fourth pull-down control transistor M11.

Specifically, when the first pull-down control transistor M8 is not failed, the selection transistor M19 is turned off, the fourth clock signal terminal CLKM receives a valid clock signal, corresponding to the implementation in FIG. 2, the valid clock signal is a high level signal, the fourth clock signal terminal CLKN receives an invalid clock signal, corresponding to the implementation in FIG. 2, the invalid clock signal is a low level signal. At this time, the valid clock signal makes the first and second electrodes of the first pull-down control transistor M8 electrically coupled to each other, and thus, the valid clock signal is directly transmitted to the pull-down control terminal QB_1 of the pull-down sub-circuit 132. Also, the first electrode and the second electrode of the second pull-down control transistor M9 are electrically coupled to each other, and the signal output by the second level signal terminal VGL1 is transmitted to the pull-up control terminal Q of the pull-up sub-circuit 131, so as to pull down a potential at the pull-up control terminal Q of the pull-up sub-circuit 131. At this time, the control terminal QB_1 of the pull-down sub-circuit 132 receives the valid clock signal input through the fourth clock signal terminal CLKM, so that the input terminal and the output terminal of the pull-down sub-circuit 132 are electrically coupled to each other, and the potential at the signal output terminal is pulled down through the signal input through the third level signal terminal VGL2. At this time, the pull-down control terminal QB_2 of the pull-down sub-circuit 132 is in a floating state.

When the invalid clock signal is supplied to the fourth clock signal terminal CLKM, the valid signal is supplied to the fourth clock signal terminal CLKN, and the valid signal is supplied to the fifth clock signal terminal CLKL, at this time, the first and second electrodes of the selection transistor M19 are electrically coupled to each other, and the valid clock signal input through the fourth clock signal terminal CLKN is input to the pull-down control terminals QB_1 and QB_2 of the pull-down sub-circuit 132 through the fourth pull-down control transistor M11. Therefore, the input terminal and the output terminal of the pull-down sub-circuit 132 can be controlled to be electrically coupled to each other, and the potential at the signal output terminal is pulled down.

Meanwhile, the potential at the pull-up control terminal Q of the pull-up sub-circuit 131 can be pulled down by the second pull-down control transistor M9 and the fifth pull-down control transistor M12.

As an implementation of the present disclosure, a signal input through the first level signal terminal VDD is a high level signal, and both a signal input through the second level signal terminal VGL1 and a signal input through the third level signal terminal VGL2 are low level signals. Alternatively, a voltage input through the second level signal terminal VGL1 is less than a voltage input through the third level signal terminal VGL2, that is, a level of the signal input through the third level signal terminal VGL2 is higher than a level of the signal input through the second level signal terminal VGL1, so that the potential at the pull-up control terminal Q of the pull-up sub-circuit 131 can be pulled down more thoroughly.

In the particular implementation shown in FIG. 2, the second electrode of the selection transistor M19 is directly and electrically coupled to the second electrode of the first pull-down control transistor M8, and the first electrode of the selection transistor M19 is directly and electrically coupled to the second electrode of the fourth pull-down control transistor M11. As an implementation, the second electrode of the selection transistor M19 may be indirectly and electrically coupled to the second electrode of the first pull-down control transistor M8, and the first electrode of the selection transistor M19 may be indirectly and electrically coupled to the second electrode of the fourth pull-down control transistor M11. It should be noted that, whether directly or indirectly coupled, when the selection transistor M19 is turned on, the signal input from the fourth clock signal terminal CLKN can be transmitted to the first pull-down control sub-circuit 142 through the selection transistor M19.

FIG. 9 shows a case where the second electrode of the selection transistor M19 is indirectly and electrically coupled to the second electrode of the first pull-down control transistor M8, and the first electrode of the selection transistor M19 is indirectly and electrically coupled to the second electrode of the fourth pull-down control transistor M11, specifically, the second electrode of the selection transistor M19 is electrically coupled to the second electrode of the first pull-down control transistor M8 through a first anti-interference transistor M22, and the first electrode of the selection transistor M19 is electrically coupled to the second electrode of the fourth pull-down control transistor M11 through a second anti-interference transistor M23.

As shown in FIG. 9, a gate electrode of the first anti-interference transistor M22 and a second electrode of the first anti-interference transistor M22 are electrically coupled to the second electrode of the first pull-down control transistor M8, and a first electrode of the first anti-interference transistor M22 is electrically coupled to the second electrode of the selection transistor M19.

As shown in FIG. 9, a gate electrode of the second anti-interference transistor M23 and a second electrode of the second anti-interference transistor M23 are electrically coupled to the first electrode of the selection transistor M19, and a first electrode of the second anti-interference transistor M23 is electrically coupled to the second electrode of the fourth pull-down control transistor M11.

The first anti-interference transistor M22 and the second anti-interference transistor M23 are provided to prevent the first pull-down control transistor M8 and the fourth pull-down control transistor M11 from affecting each other, thereby improving stability of output of the pull-down control circuit 140.

In the particular implementations shown in FIG. 2, and FIG. 6 through FIG. 9, the second electrode of the second pull-down control transistor M9 is directly and electrically coupled to the second level signal terminal VGL1, and the second electrode of the fifth pull-down control transistor M12 is directly and electrically coupled to the second level signal terminal VGL1. In the implementations shown in FIG. 4 and FIG. 5, the second electrode of the second pull-down control transistor M9 is electrically coupled to the second level signal terminal VGL1 through a first anti-leakage transistor M9', and the second electrode of the fifth pull-down control transistor M12 is electrically coupled to the second level signal terminal VLG1 through a second anti-leakage transistor M12'.

Specifically, a gate electrode of the first anti-leakage transistor M9' is electrically coupled to the gate electrode of the second pull-down control transistor M9, a first electrode of the first anti-leakage transistor M9' is electrically coupled to the second electrode of the second pull-down control transistor M9, and a second electrode of the first anti-leakage transistor M9' is electrically coupled to the second level signal terminal VGL1.

Similarly, a gate electrode of the second anti-leakage transistor M12' is electrically coupled to the gate electrode of the fifth pull-down control transistor M12, the second electrode of the fifth pull-down control transistor M12 is electrically coupled to a first electrode of the second anti-leakage transistor M12', and a second electrode of the second anti-leakage transistor M12' is electrically coupled to the second level signal terminal VGL1.

It is easily understood that the first anti-leakage transistor M9' is turned on or off in synchronization with the second pull-down control transistor M9, so that the signal input through the second level signal terminal VGL1 can be prevented from interfering with the output signal of the pull-down control circuit 140.

Likewise, the second anti-leakage transistor M12' is turned on or off in synchronization with the fifth pull-down control transistor M12, so that the signal input through the second level signal terminal VGL1 can be prevented from interfering with the output signal of the pull-down control circuit 140.

In the present disclosure, the shift register unit further includes a reset circuit 150, as shown in FIG. 1, an input terminal of the reset circuit 150 is electrically coupled to the second level signal terminal VGL1, an output terminal of the reset circuit 150 is electrically coupled to the pull-up control terminal Q of the pull-up sub-circuit 131, a control terminal of the reset circuit 150 is electrically coupled to a reset signal terminal, and the reset circuit 150 is configured to control the input terminal of the reset circuit 150 to be electrically coupled to or decoupled from the output terminal of the reset circuit 150 according to a signal provided by the reset signal terminal.

Specifically, when the control terminal of the reset circuit 150 receives a first reset control signal, the input terminal of the reset circuit 150 and the output terminal of the reset circuit 150 are electrically coupled to each other, so that the pull-up control terminal Q of the pull-up sub-circuit 131 can be reset by using the low level signal input through the second level signal terminal VGL1; when the control terminal of the reset circuit 150 receives a second reset control signal, the input terminal of the reset circuit 150 and the output terminal of the reset circuit 150 are decoupled from each other, so that the pull-up control terminal Q of the pull-up sub-circuit 131 is prevented from being affected.

As an implementation, as shown in FIG. 2, the reset circuit 150 may include a first reset transistor M7, a second electrode of the first reset transistor M7 is electrically coupled, directly or indirectly, to the second level signal terminal VGL1, and a first electrode of the first reset transistor M7 is electrically coupled to the pull-up control terminal Q of the pull-up sub-circuit 131.

When a gate electrode of the first reset transistor M7 receives the first reset control signal, the first and second electrodes of the first reset transistor M7 are electrically coupled to each other, and when the gate electrode of the first reset transistor M7 receives the second reset control signal, the first and second electrodes of the first reset transistor M7 are electrically decoupled from each other.

In the implementation shown in FIG. 2, the second electrode of the first reset transistor M7 is directly electrically coupled to the second level signal terminal VGL1.

Figure 4:
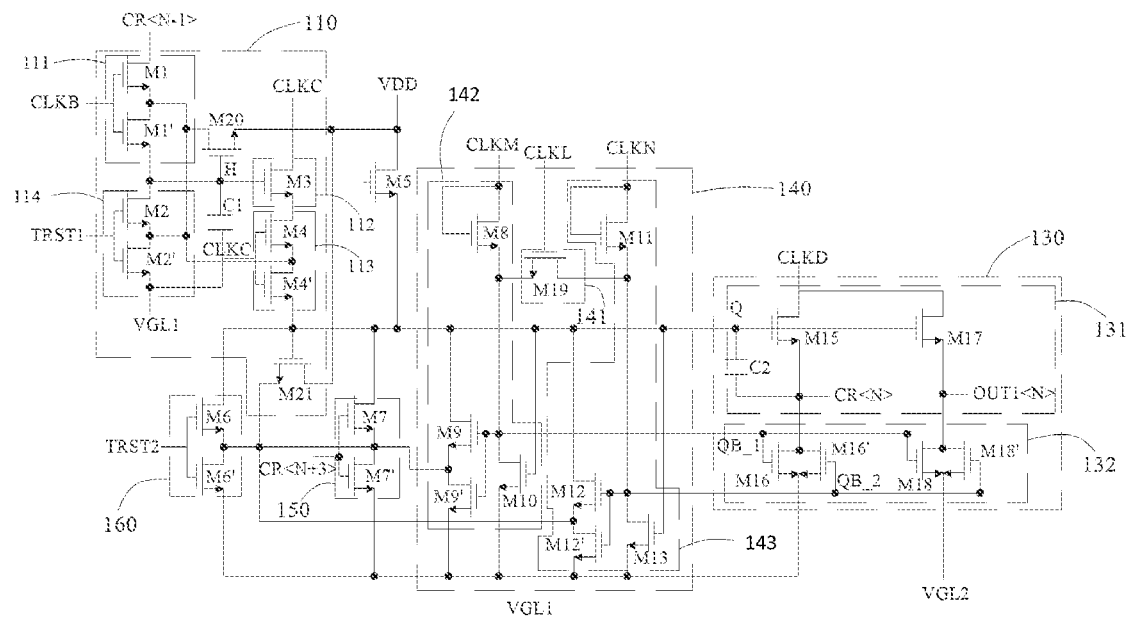
FIG. 4 is a schematic circuit diagram of a shift register unit provided by the present disclosure.

In the implementation shown in FIG. 4, the second electrode of the first reset transistor M7 is indirectly electrically coupled to the second level signal terminal VGL1. Specifically, the reset circuit 150 further includes a third anti-leakage transistor M7', a gate electrode of the third anti-leakage transistor MT is electrically coupled to the gate electrode of the first reset transistor M7, a first electrode of the third anti-leakage transistor MT is electrically coupled to the second electrode of the first reset transistor M7, and a second electrode of the third anti-leakage transistor MT is electrically coupled to the second level signal terminal VGL1.

The third anti-leakage transistor MT is turned on or off in synchronization with the first reset transistor M7, so that it is possible to prevent the level of the second level signal terminal VGL1 from affecting the pull-up control terminal Q of the pull-up sub-circuit 131 at a time when reset is not required.

As an implementation, the shift register unit may further include a noise reduction circuit 160, an input terminal of the noise reduction circuit 160 is electrically coupled to the second level signal terminal VGL1, an output terminal of the noise reduction circuit 160 is electrically coupled to the pull-up control terminal Q of the pull-up sub-circuit 131, and a control terminal of the noise reduction circuit 160 is electrically coupled to a noise reduction signal terminal TRST2. The noise reduction circuit 160 is configured to control the input terminal of the noise reduction circuit 160 and the output terminal of the noise reduction circuit 160 to be electrically coupled to or decoupled from each other according to a signal received by the control terminal of the noise reduction circuit 160.

Specifically, when the control terminal of the noise reduction circuit 160 receives a first noise reduction signal, the input terminal of the noise reduction circuit 160 and the output terminal of the noise reduction circuit 160 are electrically coupled to each other; when the control terminal of the noise reduction circuit 160 receives a second noise reduction signal, the input terminal of the noise reduction circuit 160 and the output terminal of the noise reduction circuit 160 are electrically decoupled from each other.

The noise reduction circuit 160 is used to reduce the noise of the pull-up control terminal Q of the pull-up sub-circuit 131, so as to ensure that the next cycle can be performed normally. Before each detection stage is ended, the noise reduction circuit 160 is required to reduce the noise of the pull-up control terminal Q of the pull-up sub-circuit 131, so as to ensure that the display stage of the next scanning period can be performed smoothly.

In the present disclosure, the noise reduction circuit 160 is not particularly limited to a specific structure, for example, in the implementation shown in FIG. 2, the noise reduction circuit 160 includes a noise reduction transistor M6, a second electrode of the noise reduction transistor M6 is electrically coupled, directly or indirectly, to the second level signal terminal VGL1, and a first electrode of the noise reduction transistor M6 is electrically coupled to the pull-up control terminal Q of the pull-up sub-circuit 131.

When a gate electrode of the noise reduction transistor M6 receives the first noise reduction signal, the first electrode and the second electrode of the noise reduction transistor M6 are electrically coupled to each other; when the gate electrode of the noise reduction transistor M6 receives the second noise reduction signal, the first and second electrodes of the noise reduction transistor M6 are electrically decoupled from each other.

Figure 5:
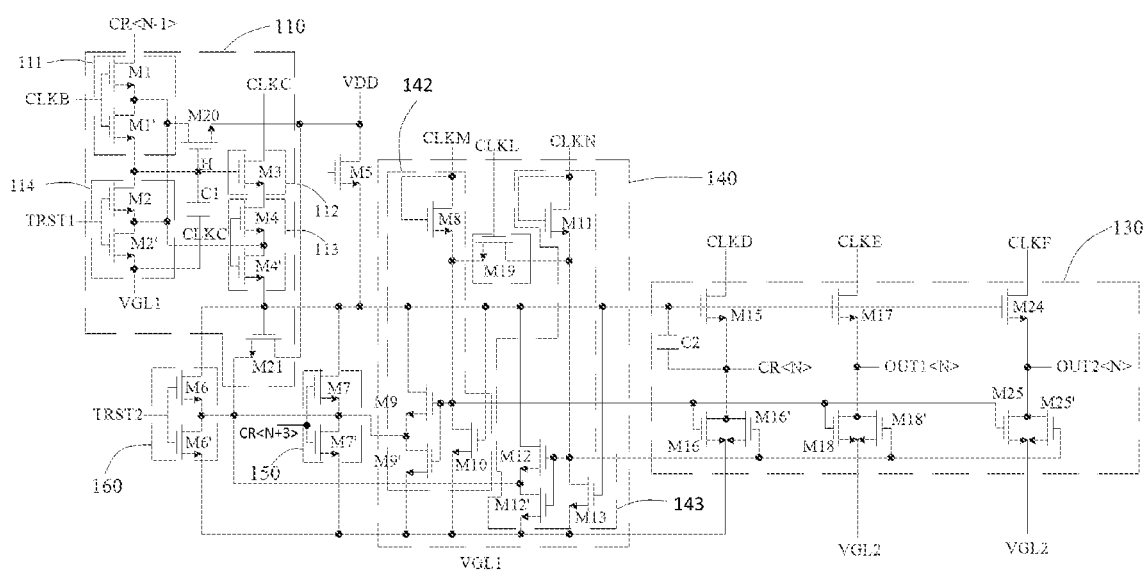
FIG. 5 is a schematic circuit diagram of a shift register unit provided by the present disclosure.
Figure 6:
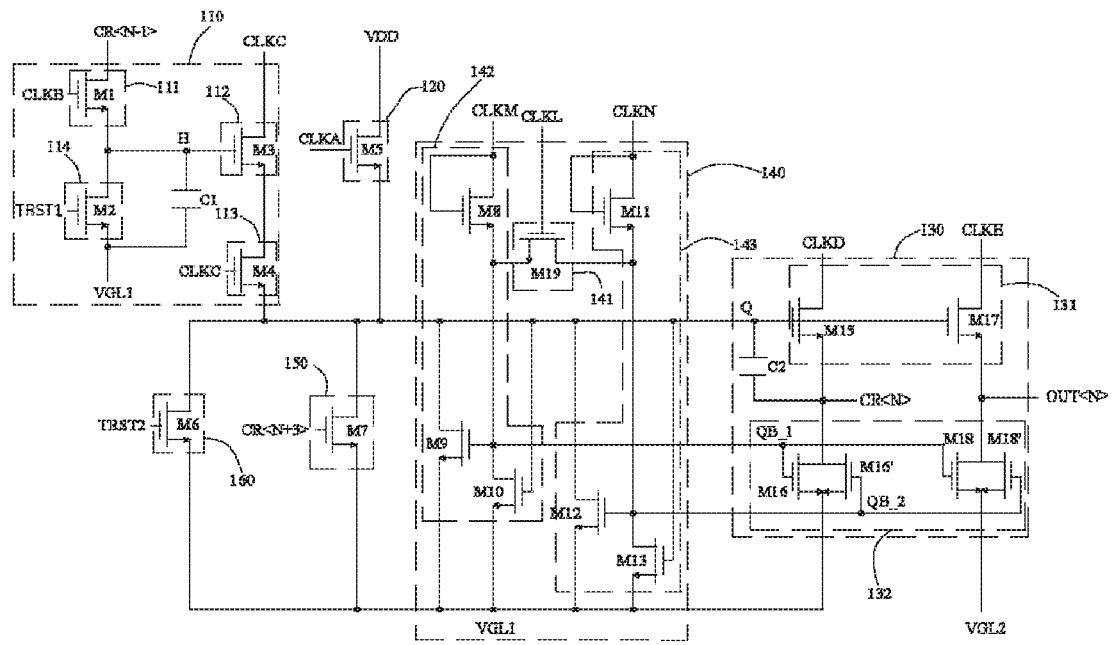
FIG. 6 is a schematic circuit diagram of a shift register unit provided by the present disclosure.
Figure 7:
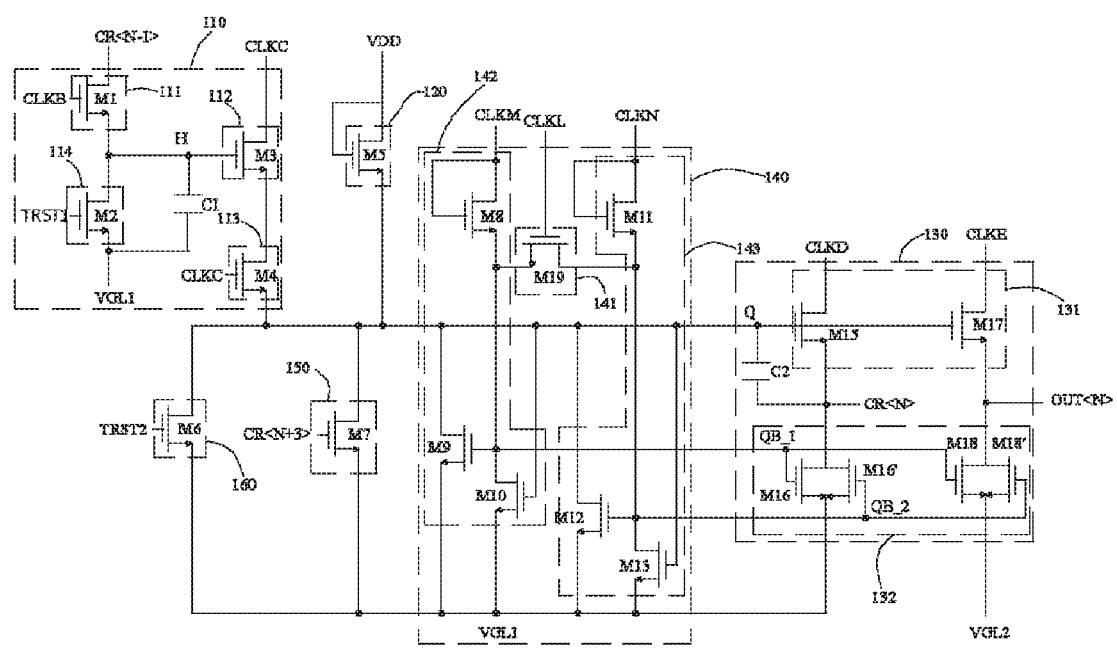
FIG. 7 is a schematic circuit diagram of a shift register unit provided by the present disclosure.

As an implementation, as shown in FIG. 5, the noise reduction circuit 160 may further include a fourth anti-leakage transistor M6', a gate electrode of the fourth anti-leakage transistor M6' is electrically coupled to the gate electrode of the noise reduction transistor M6, a first electrode of the fourth anti-leakage transistor M6' is electrically coupled to the second electrode of the noise reduction transistor M6, and a second electrode of the fourth anti-leakage transistor M6' is electrically coupled to the second level signal terminal VGL1.

In the present disclosure, the noise reduction transistor M6 is turned on or off in synchronization with the fourth anti-leakage transistor M6', so that it is possible to effectively prevent the potential at the pull-up control terminal Q of the pull-up sub-circuit 131 from being pulled down to reduce noise by the signal input through the second level signal terminal VGL1 when it is not required to pull down the potential at the pull-up control terminal Q of the pull-up sub-circuit 131 to reduce noise.

In the present disclosure, the detection signal input sub-circuit 110 is not particularly limited to a specific structure, as long as the detection scanning control signal capable of electrically coupling the input terminal of the pull-up sub-circuit 131 to the output terminal of the pull-up sub-circuit 131 can be provided to the pull-up control terminal Q of the pull-up sub-circuit 131 in the detection sub-phase.

As shown in FIG. 2, the detection signal input sub-circuit 110 may include a detection trigger signal input sub-circuit 111, a detection signal output sub-circuit 112, a switch sub-circuit 113, a detection signal reset sub-circuit 114, and a first storage sub-circuit C1.

As shown in FIG. 2, a control terminal of the detection trigger signal input sub-circuit 111 is formed as the first control terminal of the detection signal input sub-circuit 110, that is, the control terminal of the detection trigger signal input sub-circuit 111 is electrically coupled to the first clock signal terminal CLKB, an output terminal of the detection trigger signal input sub-circuit 111 is electrically coupled to a control terminal of the detection signal output sub-circuit 112, and an input terminal of the detection trigger signal input sub-circuit 111 is formed as an input terminal of the detection signal input sub-circuit 110. The detection trigger signal input sub-circuit 111 is configured to control the input terminal of the detection trigger signal input sub-circuit 111 and the output terminal of the detection trigger signal input sub-circuit 111 to be electrically coupled to or decoupled from each other according to a signal received at the control terminal of the detection trigger signal input sub-circuit 111.

The input terminal of the detection trigger signal input sub-circuit 111 and the output terminal of the detection trigger signal input sub-circuit 111 may be electrically coupled to each other when the control terminal of the detection trigger signal input sub-circuit 111 receives a valid first clock signal, and the input terminal of the detection trigger signal input sub-circuit 111 and the output terminal of the detection trigger signal input sub-circuit 111 can be electrically decoupled from each other when the control terminal of the detection trigger signal input sub-circuit 111 receives an invalid first clock signal. The "valid" and "invalid" herein are merely used to distinguish between high and low levels of the first clock signal. The "valid first clock signal" may represent one of a high level signal and a low level signal, and the "invalid first clock signal" may represent the other of the high level signal and the low level signal.

Here, it should be explained that a signal input through the input terminal of the detection trigger signal input sub-circuit 111 is used to control the detection signal output sub-circuit 112. Specifically, an input terminal of the detection signal output sub-circuit 112 is electrically coupled to the second clock signal terminal CLKC, and an output terminal of the detection signal output sub-circuit 112 is electrically coupled to an input terminal of the switch sub-circuit 113. The detection signal output sub-circuit 112 is configured to control the input terminal of the detection signal output sub-circuit 112 and the output terminal of the detection signal output sub-circuit 112 to be electrically coupled to or decoupled from each other according to a signal received by the control terminal of the detection signal output sub-circuit 112.

When the control terminal of the detection signal output sub-circuit 112 receives a valid detection output control signal, the input terminal of the detection signal output sub-circuit 112 and the output terminal of the detection signal output sub-circuit 112 are electrically coupled to each other, and when the control terminal of the detection signal output sub-circuit 112 receives an invalid detection output control signal, the input terminal of the detection signal output sub-circuit 112 and the output terminal of the detection signal output sub-circuit 112 are electrically decoupled from each other.

An output terminal of the switch sub-circuit 113 is electrically coupled to the control terminal of the pull-up sub-circuit 131, and a control terminal of the switch sub-circuit 113 is formed as the second control terminal of the detection signal input sub-circuit 110, that is, the control terminal of the switch sub-circuit 113 is electrically coupled to the second clock signal terminal CLKC.

The switch sub-circuit 113 is configured to control the input terminal of the switch sub-circuit 113 and the output terminal of the switch sub-circuit 113 to be electrically coupled to or decoupled from each other according to a signal received by the control terminal of the switch sub-circuit 113. Specifically, when the control terminal of the switch sub-circuit 113 receives the valid second clock signal, the input terminal of the switch sub-circuit 113 and the output terminal of the switch sub-circuit 113 are electrically coupled to each other; when the control terminal of the switch sub-circuit 113 receives the invalid second clock signal, the input terminal of the switch sub-circuit 113 is electrically decoupled from the output terminal of the switch sub-circuit 113.

An input terminal of the detection signal reset sub-circuit 114 is electrically coupled to the second level signal terminal VGL1, and an output terminal of the detection signal reset sub-circuit 114 is electrically coupled to the control terminal of the detection signal output sub-circuit 112. A control terminal of the detection signal reset sub-circuit 114 is electrically coupled to a detection reset signal terminal TRST1. The detection signal reset sub-circuit 114 is configured to control the input terminal of the detection signal reset sub-circuit 114 and the output terminal of the detection signal reset sub-circuit 114 to be electrically coupled to or decoupled from each other according to a signal received by the control terminal of the detection signal reset sub-circuit 114.

When the control terminal of the detection signal reset sub-circuit 114 receives a first detection reset signal, the input terminal of the detection signal reset sub-circuit 114 and the output terminal of the detection signal reset sub-circuit 114 are electrically coupled to each other; when the control terminal of the detection signal reset sub-circuit 114 receives a second detection reset signal, the input terminal and the output terminal of the detection signal reset sub-circuit 114 are electrically decoupled from each other.

A first terminal of the first storage sub-circuit C1 is electrically coupled to the control terminal H of the detection signal output sub-circuit 112, and a second terminal of the first storage sub-circuit C1 is electrically coupled to the second level signal terminal VGL1.

In the present disclosure, the first storage sub-circuit C1 is configured to store a signal input through the detection trigger signal input sub-circuit 111, and maintain the voltage of the control terminal of the detection signal output sub-circuit 112 when the input and output terminals of the detection trigger signal input sub-circuit 111 are electrically decoupled from each other, and maintain the output state.

The working principle of the detection signal input sub-circuit 110 will be described subsequently in detail with reference to the signal timing diagram.

As an implementation of the present disclosure, as shown in FIG. 2, the detection trigger signal input sub-circuit 111 includes a detection signal input transistor M1, a gate electrode of the detection signal input transistor M1 is electrically coupled to the first clock signal terminal CLKB, a first electrode of the detection signal input transistor M1 is formed as the input terminal of the detection trigger signal input sub-circuit 111, and a second electrode of the detection signal input transistor M1 is formed as the output terminal of the detection trigger signal input sub-circuit 111.

When the gate electrode of the detection signal input transistor M1 receives a valid first clock signal, the first electrode of the detection signal input transistor M1 and the second electrode of the detection signal input transistor M1 are electrically coupled to each other; when the gate electrode of the sensing signal input transistor M1 receives an invalid first clock signal, the first electrode of the sensing signal input transistor M1 and the second electrode of the sensing signal input transistor M1 are electrically decoupled from each other.

In the implementation shown in FIG. 2, the second electrode of the detection signal input transistor M1 is directly electrically coupled to the control terminal H of the detection signal output sub-circuit 112. In the implementation shown in FIG. 4, the second electrode of the detection signal input transistor M1 is indirectly electrically coupled to the control terminal H of the detection signal output sub-circuit 112.

Specifically, in order to avoid an electric leakage, the detection trigger signal input sub-circuit 111 may further include a fifth anti-leakage transistor M1', a gate electrode of the fifth anti-leakage transistor M1' is electrically coupled to the gate electrode of the detection signal input transistor M1, a first electrode of the fifth anti-leakage transistor M1' is electrically coupled to the second electrode of the detection signal input transistor M1, and a second electrode of the fifth anti-leakage transistor M1' is electrically coupled to the control terminal H of the detection signal output sub-circuit 112.

The fifth anti-leakage transistor M1' is turned on or off in synchronization with the detection signal input transistor M1, so that it is possible to prevent the output terminal of the detection trigger signal input sub-circuit 111 from leaking electricity.

In the present disclosure, the detection signal reset sub-circuit 114 is not particularly limited to a specific structure. As an implementation, the detection signal reset sub-circuit 114 includes a second reset transistor M2, a first electrode of the second reset transistor M2 is electrically coupled to the output terminal of the detection trigger signal input sub-circuit 111, a second electrode of the second reset transistor M2 is electrically coupled, directly or indirectly, to the second level signal terminal VGL1, and a gate electrode of the second reset transistor M2 is formed as the control terminal of the detection signal reset sub-circuit 114.

When the gate electrode of the second reset transistor M2 receives the first detection reset control signal, the first electrode of the second reset transistor M2 and the second electrode of the second reset transistor M2 are electrically coupled to each other, and when the gate electrode of the second reset transistor M2 receives the second detection reset control signal, the first electrode of the second reset transistor M2 and the second electrode of the second reset transistor M2 are electrically decoupled from each other.

Regardless of whether the second electrode of the second reset transistor M2 is directly electrically coupled to the second level signal terminal VGL1 or indirectly electrically coupled to the second level signal terminal VGL1, when the first electrode and the second electrode of the second reset transistor M2 are electrically coupled to each other, the input terminal of the detection signal reset sub-circuit 114 including the second reset transistor M2 is electrically coupled to the output terminal of the detection signal reset sub-circuit 114.

In the particular implementation shown in FIG. 4, the second electrode of the second reset transistor M2 is indirectly electrically coupled to the second level signal terminal VGL1. Specifically, the detection signal reset sub-circuit 114 further includes a sixth anti-leakage transistor M2', a gate electrode of the sixth anti-leakage transistor M2' is electrically coupled to the gate electrode of the second reset transistor M2, a first electrode of the sixth anti-leakage transistor M2' is electrically coupled to the second electrode of the second reset transistor M2, and a second electrode of the sixth anti-leakage transistor M2' is electrically coupled to the second level signal terminal VGL1.

The sixth anti-leakage transistor M2' is turned on or off in synchronization with the second reset transistor M2, so that the second level signal terminal VGL1 can be prevented from resetting the output terminal of the detection trigger signal input sub-circuit 111 at a phase other than a scanning reset sub-phase.

In the present disclosure, the switch sub-circuit 113 is not particularly limited to a specific structure. In an implementation, the switch sub-circuit 113 includes a switch transistor M4, a gate electrode of the switch transistor M4 is formed as the control terminal of the switch sub-circuit 113, a first electrode of the switch transistor M4 is formed as the input terminal of the switch sub-circuit 113, and a second electrode of the switch transistor M4 is electrically coupled, directly or indirectly, to the pull-up control terminal Q of the pull-up sub-circuit 131.

When the gate electrode of the switching transistor M4 receives a valid second clock signal, the first electrode of the switching transistor M4 and the second electrode of the switching transistor M4 are electrically coupled to each other; when the gate electrode of the switching transistor M4 receives an invalid second clock signal, the first electrode of the switching transistor M4 and the second electrode of the switching transistor M4 are electrically decoupled from each other.

FIG. 2 shows a case where the second electrode of the switching transistor M4, as the output terminal of the switching sub-circuit 113, is directly electrically coupled to the pull-up control terminal Q of the pull-up sub-circuit 131. The present disclosure is not limited thereto, and as an implementation, the switch sub-circuit 113 may further include a seventh anti-leakage transistor M4', as shown in FIG. 4, a gate electrode of the seventh anti-leakage transistor M4' is electrically coupled to the gate electrode of the switch transistor M4, a first electrode of the seventh anti-leakage transistor M4' is electrically coupled to the second electrode of the switch transistor M4, and a second electrode of the seventh anti-leakage transistor M4' is electrically coupled to the pull-up control terminal Q of the pull-up sub-circuit 131.

The seventh leakage preventing transistor M4' is turned on or off in synchronization with the switching transistor M4, so that the signal of the second clock signal terminal CLKC can be prevented from affecting the pull-up control terminal Q of the pull-up sub-circuit 131.

In a case where the shift register unit includes the noise reduction circuit 160, the detection trigger signal input sub-circuit 111 includes the detection signal input transistor M1 and the fifth anti-leakage transistor M1', the detection signal reset sub-circuit 114 includes the second reset transistor M2 and the sixth anti-leakage transistor M2', and the switch sub-circuit 113 includes the switch transistor M4 and the seventh anti-leakage transistor M4', as an implementation, as shown in FIG. 4 and FIG. 5, the shift register unit may further include an eighth anti-leakage transistor M20 and a ninth anti-leakage transistor M21.

As shown in FIG. 4, a gate electrode of the eighth anti-leakage transistor M20 is electrically coupled to the output terminal of the detection trigger signal input sub-circuit 111, a first electrode of the eighth anti-leakage transistor M20 is electrically coupled to the second electrode of the detection input transistor M1, and a second electrode of the eighth anti-leakage transistor M20 is electrically coupled to the input terminal of the display signal input sub-circuit 120.

Accordingly, a gate electrode of the ninth anti-leakage transistor M21 is electrically coupled to the pull-up control terminal Q of the pull-up sub-circuit 131, a first electrode of the ninth anti-leakage transistor M21 is electrically coupled to the input terminal of the display signal input sub-circuit 120, and a second electrode of the ninth anti-leakage transistor M21 is electrically coupled to the output terminal of the noise reduction circuit 160.

The eighth anti-leakage transistor M20 and the ninth anti-leakage transistor M21 are provided to prevent interference between the display signal input sub-circuit 120 and the detection signal input sub-circuit 110.

The shift register unit provided by the present disclosure may be applied to a shift register, and particularly, a plurality of shift register units may be cascaded to form the shift register.

The term "cascade" or any variant thereof means that the output terminal of the previous stage of shift register unit is electrically coupled to the input terminal of the next stage of shift register unit. Since the signal output by the output terminal of the shift register unit is mainly used for driving thin film transistors coupled to gate lines to be turned on or off, in order to ensure that the gate lines can validly turn on or off the thin film transistors, in an implementation, the output circuit may include a cascade output sub-circuit and at least one scanning signal output sub-circuit.

The pull-up sub-circuit includes a cascade pull-up sub-circuit and a scanning signal output pull-up sub-circuit, a control terminal of the cascade pull-up sub-circuit is electrically coupled to a control terminal of the scanning signal output pull-up sub-circuit and forms the control terminal of the pull-up sub-circuit.

The signal output terminal includes a cascade signal output terminal of the cascade output sub-circuit and a scanning signal output terminal of the scanning signal output sub-circuit.

The pull-down sub-circuit includes a cascade pull-down sub-circuit and a scanning signal output pull-down sub-circuit, a control terminal of the cascade pull-down sub-circuit and a control terminal of the scanning signal output pull-down sub-circuit are electrically coupled and form the control terminal of the pull-down sub-circuit.

The output terminal of the pull-up sub-circuit is electrically coupled to the corresponding scanning signal output terminal, the output terminal of the pull-down sub-circuit is electrically coupled to the corresponding scanning signal output terminal, the output terminal of the cascade pull-down sub-circuit is electrically coupled to the cascade signal output terminal, and the output terminal of the cascade pull-up sub-circuit is electrically coupled to the cascade signal output terminal.

In implementations shown in FIGS. 2, 4, 5, 6, 7, 8, and 9, the output circuit includes one cascade output sub-circuit and one scanning signal output sub-circuit. In the implementation shown in FIG. 5, the output circuit includes one cascade output sub-circuit and two scanning signal output sub-circuits.

The shift register unit shown in each of figures of the present disclosure is the $N^{th}$ stage of shift register unit in a shift register, the cascade signal output terminal is denoted by a reference sign CR<N>, and scanning signal output terminals are respectively denoted by reference signs OUT<N>, OUT1<N>, OUT2<N>. The output terminals OUT<N>, OUT1<N>, OUT2<N> may be electrically coupled to different gate lines of the display panel, respectively.

In the figures, CR<N−1> represents the cascade signal output terminal of the $(N-1)^{th}$ stage of shift register unit, CR<N−2> represents the cascade signal output terminal of the $(N-2)^{th}$ stage of shift register unit, and CR<N+3> represents the cascade signal output terminal of the $(N+3)^{th}$ stage of shift register unit. In addition, H<N+2> represents the control terminal of the detection signal output sub-circuit 112 of the $(N+2)^{th}$ stage of shift register unit.

Figure 8:
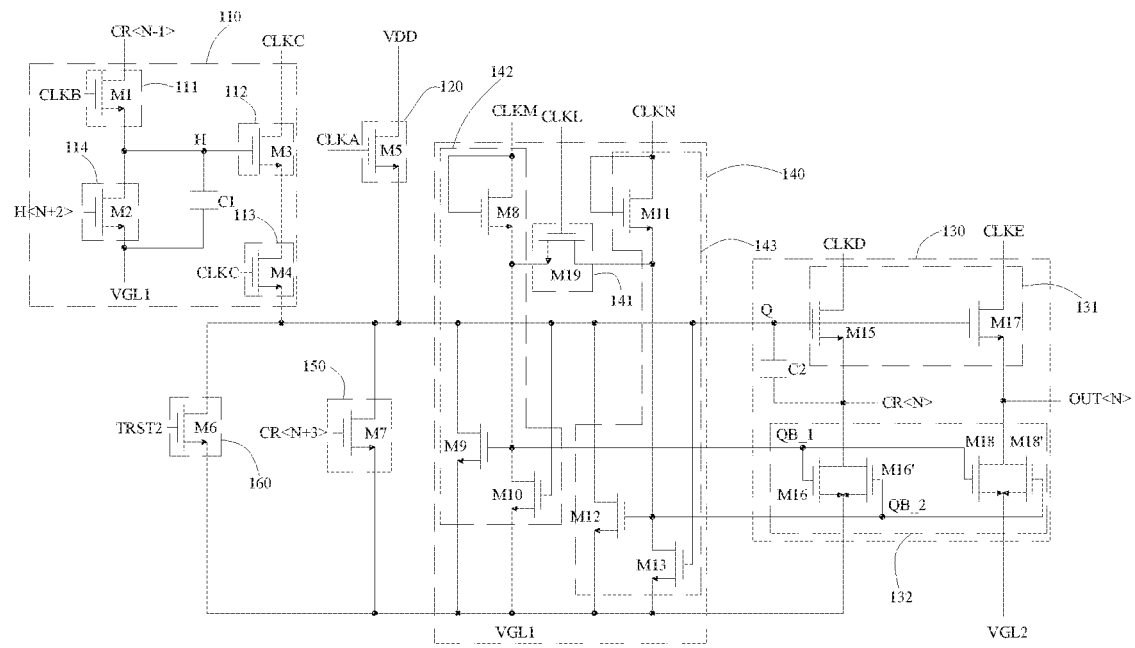
FIG. 8 is a schematic circuit diagram of a shift register unit provided by the present disclosure.

In some implementations, the control terminal of the detection signal reset sub-circuit 114 of the $N^{th}$ stage of shift register unit may be electrically coupled to the control terminal H<N+2> of the detection signal output sub-circuit 112 of the $(N+2)^{th}$ stage of shift register unit. That is, the gate electrode of the second reset transistor M2 of the $N^{th}$ stage of shift register unit may be electrically coupled to the control terminal H<N+2> of the detection signal output sub-circuit 112 of the $(N+2)^{th}$ stage of shift register unit, as shown in FIG. 8.

In the present disclosure, the pull-up sub-circuit 131 is not particularly limited to a specific structure. As an implementation, the cascade pull-up sub-circuit of the pull-up sub-circuit 131 includes a cascade pull-up transistor M15 and a storage capacitor C2, each scanning signal output pull-up sub-circuit of the pull-up sub-circuit 131 includes a scanning signal output pull-up transistor. For example, in the implementations shown in FIGS. 2, 4, 6, 7, 8, and 9, there is only one scanning signal output pull-up sub-circuit which includes a scanning signal output pull-up transistor M17. In the particular implementation shown in FIG. 5, two scanning signal output pull-up sub-circuits, i.e., a scanning signal output pull-up transistor M17 and a scanning signal output pull-up transistor M24, are included.

A gate electrode of cascade pull-up transistor M15 forms the pull-up control terminal Q of pull-up sub-circuit 131, a first electrode of cascade pull-up transistor M15 forms the input terminal of the cascade pull-up sub-circuit, and a second electrode of cascaded pull-up transistor M15 forms the output terminal of the cascade pull-up sub-circuit. One terminal of the storage capacitor C2 is electrically coupled to the gate electrode of the cascade pull-up transistor M15, and the other terminal of the storage capacitor C2 is electrically coupled to the second electrode of the cascade pull-up transistor M15.

The gate electrode of the scanning signal output pull-up transistor is electrically coupled to the gate electrode of the cascade pull-up transistor, the first electrode of the scanning signal output pull-up transistor is formed as the input terminal of the scanning signal output pull-up sub-circuit, and the second electrode of the scanning signal output pull-up transistor is formed as the output terminal of the scanning signal output pull-up sub-circuit.

In the implementations shown in FIGS. 2 and 4, the pull-up sub-circuit 131 has only one input terminal, i.e., the input terminal of the pull-up sub-circuit 131 is electrically coupled to the third clock signal terminal CLKD.

In the implementation shown in FIG. 5, the pull-up sub-circuit 131 includes three input terminals, and the three input terminals of the pull-up sub-circuit 131 are electrically coupled to three third clock signal terminals, respectively. Specifically, the first electrode of the cascade pull-up transistor M15 is electrically coupled to the third clock signal terminal CLKD, a first electrode of the scanning signal output pull-up transistor M17 is electrically coupled to the third clock signal terminal CLKE, and a first electrode of the scanning signal output pull-up transistor M24 is electrically coupled to the third clock signal terminal CLKF.

In the implementations shown in FIGS. 6 through 9, the first electrode of the cascade pull-up transistor M15 is electrically coupled to the third clock signal terminal CLKD, and the first electrode of the scanning signal output pull-up transistor M17 is electrically coupled to the third clock signal terminal CLKE.

In the present disclosure, the three third clock signal terminals CLKD, CLKE, CLKF may be the same as or different from each other.

In the present disclosure, there is no particular limitation on a specific structure of the pull-down sub-circuit 132.

In the implementations shown in FIGS. 2, 4 to 9, the cascade pull-down sub-circuit of the pull-down sub-circuit 132 includes a plurality of cascade pull-down transistors, and the number of the cascade pull-down transistors is the same as the number of the control terminals of the pull-down sub-circuit and the cascade pull-down transistors correspond to the control terminals of the pull-down sub-circuit in a one-to-one mode, the scanning signal output pull-down sub-circuit includes a plurality of scanning signal output pull-down transistors, and the number of the scanning signal pull-down output transistors is the same as the number of the control terminals of the pull-down sub-circuit and the scanning signal pull-down output transistors correspond to the control terminals of the pull-down sub-circuit in a one-to-one mode.

The gate electrodes of the cascade pull-down transistors are respectively formed as the control terminals of the pull-down sub-circuit, the first electrodes of the cascade pull-down transistors are formed as the input terminal of the cascade pull-down sub-circuit, and the second electrodes of the cascade pull-down transistors are formed as the output terminal of the cascade pull-down sub-circuit. Specifically, in an implementation where the pull-down sub-circuit 132 includes the pull-down control terminals QB_1 and QB_2, the cascade pull-down sub-circuit includes a cascade pull-down transistor M16 and a cascade pull-down transistor M16'. As can be seen from the figures that, a gate electrode of the cascade pull-down transistor M16 is electrically coupled to the pull-down control terminal QB_1, and a gate electrode of the cascade pull-down transistor M16' is electrically coupled to the pull-down control terminal QB_2.

The gate electrodes of the scanning signal output pull-down transistors are respectively electrically coupled to the corresponding control terminals of the pull-down sub-circuit, the first electrodes of the scanning signal output pull-down transistors are formed as the input terminal of the scanning signal pull-down output sub-circuit, and the second electrodes of the scanning signal output pull-down transistors are formed as the output terminal of the scanning signal pull-down output sub-circuit. In the implementations shown in FIGS. 2, 4, 6, 7, 8 and 9, there is only one scanning signal output pull-down sub-circuit, and accordingly, the scanning signal output pull-down sub-circuit includes a scanning signal output pull-down transistor M18 and a scanning signal output pull-down transistor M18'. A gate electrode of the scanning signal output pull-down transistor M18 is electrically coupled to the pull-down control terminal QB_1, and a gate electrode of the scanning signal output pull-down transistor M18' is electrically coupled to the pull-down control terminal QB_2.

In the implementation shown in FIG. 5, two scanning signal output pull-down sub-circuits are included, and accordingly, one scanning signal output pull-down sub-circuit includes the scanning signal output pull-down transistor M18 and the scanning signal output pull-down transistor M18', and the other scanning signal output pull-down sub-circuit includes a scanning signal output pull-down transistor M25 and a scanning signal output pull-down transistor M25'. The gate electrode of the scanning signal output pull-down transistor M18 is electrically coupled to the pull-down control terminal QB_1, and the gate electrode of the scanning signal output pull-down transistor M18' is electrically coupled to the pull-down control terminal QB_2. A gate electrode of the scanning signal output pull-down transistor M25 is electrically coupled to the pull-down control terminal QB_1, and a gate electrode of the scanning signal output pull-down transistor M25' is electrically coupled to the pull-down control terminal QB_2.

As a second aspect of the present disclosure, a gate driving circuit is provided, where the gate driving circuit includes at least one shift register unit group, each shift register unit group includes a plurality of shift register units which are cascaded, and at least one of the shift register units is the shift register unit provided in the present disclosure. In a single shift register unit group, for two adjacent stages of shift register units, the output signal of the next stage of shift register unit is used for reset the previous stage of shift register unit.

In the present disclosure, the gate driving circuit may include one shift register unit group, or may include a plurality of shift register unit groups. When the gate driving circuit includes one shift register unit group, all stages of shift register units are cascaded. For two adjacent stages of shift register units, the output signal of the previous stage of shift register unit is the input signal of the next stage of shift register unit, and the output signal of the next stage of shift register unit is the reset signal of the previous stage of shift register unit.

In an implementation, the gate driving circuit includes M shift register unit groups, the first M stages of shift register units of the gate driving circuit are respectively shift register units at first stages of the M shift register unit groups, and the $n^{th}$ stage of shift register unit is cascaded with the $(n-M)^{th}$ stage of shift register unit, where M is a constant value and is a natural number not less than 1, n is a variable, and n is a natural number not less than M.

In the present disclosure, the number of the shift register unit groups included in the gate driving circuit is not particularly limited, and for example, each gate driving circuit may include two shift register unit groups, where odd-numbered stages of shift register units are in one group, and even-numbered stages of shift register units are in the other group. That is, in the implementation shown in FIG. 10, M is equal to 2, the third stage of shift register unit A3 is cascaded with the first stage of shift register unit A1, and the fourth stage of shift register unit A4 is cascaded with the second stage of shift register unit A2.

As a third aspect of the present disclosure, there is provided a display panel including a gate driving circuit. The gate driving circuit is the gate driving circuit provided by the present disclosure. For the display panel, the shift register unit of the gate driving circuit includes two signal input sub-circuits, which are a detection signal input sub-circuit and a display signal input sub-circuit, respectively.

As described above, in a single stage of shift register unit, the output terminal of the detection signal input sub-circuit is electrically coupled to the control terminal of the pull-up sub-circuit, the first control terminal of the detection signal input sub-circuit is electrically coupled to the first clock signal terminal, and the second control terminal of the detection signal input sub-circuit is electrically coupled to the second clock signal terminal, so that the detection signal input sub-circuit provides the detection scanning control signal to the control terminal of the pull-up sub-circuit under control of the first clock signal input through the first clock signal terminal and the second clock signal input through the second clock signal terminal.

In a single stage of shift register unit, the output terminal of the display signal input sub-circuit is electrically coupled to the control terminal of the pull-up sub-circuit, the input terminal of the display signal input sub-circuit is electrically coupled to the first level signal terminal, and the input terminal of the display signal input sub-circuit and the output terminal of the display signal input sub-circuit are configured to provide a display scanning control signal to the control terminal of the pull-up sub-circuit under control of a signal received by the control terminal of the display signal input sub-circuit.

Figure 11:
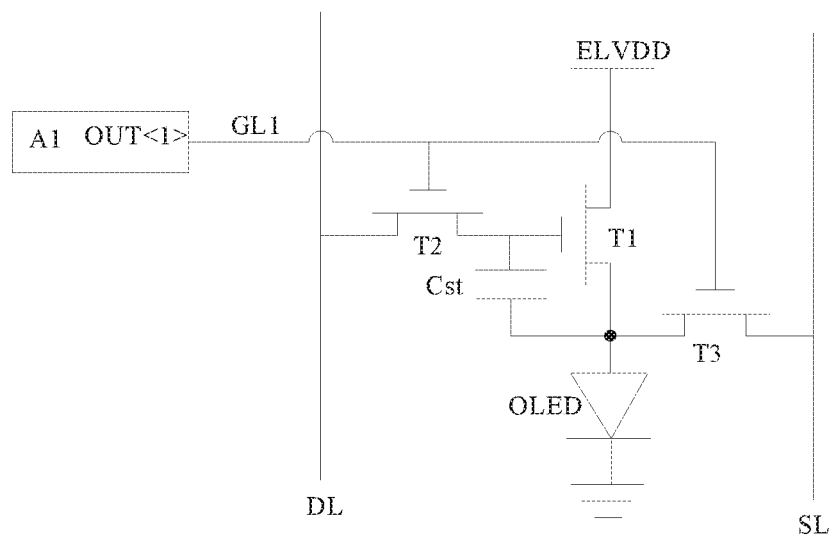
FIG. 11 is a schematic diagram of a pixel unit.

The display panel may include a plurality of data lines, a plurality of gate lines and a plurality of detection lines, the gate lines and the data lines are arranged to cross each other to divide the display panel into a plurality of pixel units. As shown in FIG. 11, each pixel unit is provided with a pixel circuit and a detection switch transistor T3, and each pixel unit includes a data writing transistor T2. In a single row of pixel units, gate electrodes of data writing transistors T2 and gate electrodes of the detection switch transistors T3 are electrically coupled to a corresponding one of the gate lines (for example, in the implementation shown in FIG. 11, the gate electrode of the data writing transistor T2 and the gate electrode of the detection switch transistor T3 are electrically coupled to the gate line GL1). When the gate line receives a display scanning signal, the data writing transistors T2 are turned on, and data input through the corresponding data line DL can be written into pixel circuits, for driving the pixel units to emit light. When the gate line receives the detection scanning signal, the detection switch transistor T3 is turned on, so that the detection signal can be collected through a detection line SL.

In the present disclosure, the pixel circuit is also not particularly limited to a specific structure. For example, in the particular implementation shown in FIG. 11, the pixel circuit includes a driving transistor T1, a data writing transistor T2, and an organic light emitting diode OLED. A first electrode of the data writing transistor T2 is electrically coupled to the corresponding data line DL, and a second electrode of the data writing transistor T2 is electrically coupled to a gate electrode of the driving transistor T1. A first electrode of the driving transistor T1 is electrically coupled to a high-level signal terminal ELVDD, a second electrode of the driving transistor T2 is electrically coupled to an anode electrode of the organic light emitting diode OLED, and a cathode electrode of the organic light emitting diode OLED is grounded.

The gate electrode of the detection switch transistor T3 is electrically coupled to the gate line GL1, a first electrode of the detection switch transistor T3 is electrically coupled to the anode electrode of the organic light emitting diode OLED, and a second electrode of the detection switch transistor T3 is electrically coupled to the detection line SL.

As a fourth aspect of the present disclosure, a driving method for driving a display panel is provided, where the display panel is the display panel provided in the present disclosure. As shown in FIG. 3, the driving method includes a plurality of frame periods (four frame periods, i.e., a first frame period 1F, a second frame period 2F, a third frame period 3F, and a fourth frame period 4F, are respectively shown in FIG. 3), each of which includes a display scanning signal output phase T1 and a detection scanning signal output phase T2. The driving method includes: controlling one of the pull-down control sub-circuits through the selection sub-circuit to provide a signal for the pull-down control terminal of the pull-down sub-circuit; in the display scanning signal output phase T1 of each frame period, providing a display trigger signal to the control terminal of the display signal input sub-circuit in the first stage of shift register unit of each shift register unit group, so as to provide a signal for the pull-up control terminal of the pull-up sub-circuit by using the display signal input sub-circuit; in the detection scanning signal output phase T2 of the first frame period, providing a detection initial signal to the detection signal input sub-unit in the first stage of shift register unit of each shift register unit group, so as to provide a signal for the pull-up control terminal of the pull-up sub-circuit by using the detection signal input sub-unit, and in different frame periods, respectively controlling detection signal input sub-units in different stages of shift register units to output, so that in a predetermined number of frame periods, each of the shift register units outputs a valid signal to the pull-up control terminal of the pull-up sub-circuit in the detection scanning signal output phase.

It should be noted that in the driving method provided by the present disclosure, the last stage of shift register unit of each shift register unit group enters the detection scanning signal output phase T2 after outputting the display scanning signal.

In the driving method provided by the present disclosure, no matter in the display scanning signal output phase or the detection scanning signal output phase, only the pull-down control sub-circuit in each shift register unit works so that a failure of a thin film transistor caused by a long-term bias voltage can be avoided.

For the particular implementation shown in FIG. 1, the driving method includes: for any shift register unit, providing a valid fourth clock signal for one of fourth clock signal terminals of the shift register unit, and providing invalid fourth clock signals for the rest fourth clock signal terminals; in the display scanning signal output phase T1 of each frame period, providing a display trigger signal STU2 to the control terminal of the display signal input sub-circuit in the first stage of shift register unit of each shift register unit group, providing a third clock signal to the third clock signal terminal of each shift register unit of the shift register unit group, and in a single shift register unit group, the third clock signal of the odd-numbered stage of shift register unit is complementary to the third clock signal of the even-numbered stage of shift register unit; in the display scanning signal output phase T1 of the first frame period, providing a detection initialization signal STU1 to the input terminal of the detection signal input sub-circuit in the first stage of shift register unit of each shift register unit group; in any two adjacent frame periods except the first frame period, providing a valid first clock signal to the first clock signal terminal CLKB of each shift register unit in the detection scanning signal output phase of the previous frame period, providing a valid second clock signal to the second clock signal terminal CLKC of each shift register unit in the detection scanning signal output phase of the next frame period, providing a valid first clock signal to the first clock signal terminal CLKB of each shift register unit in the display scanning signal output phase of the first frame period, and providing a valid second clock signal to the second clock signal terminal CLKC of each shift register unit in the detection scanning signal output phase of the first frame period. In different frame periods, valid third clock signals are provided to third clock signal terminals of different stages of shift register units respectively, so that in a preset number of frame periods, each of the shift register units receives the valid third clock signal in the detection scanning signal output phase.

In the present disclosure, for example, STU1 of the $N^{th}$ stage of shift register unit is a signal output from the cascade output signal terminal CR<N−1> of the $(N−1)^{th}$ stage of shift register unit, and STU2 of the $N^{th}$ stage of shift register unit is a signal output from the cascade output signal terminal CR<N−2> of the $(N−2)^{th}$ stage of shift register unit.

Moreover, in the present disclosure, as an example, valid STU1 and STU2 may last for a first predetermined period of time t1, as shown in FIG. 3, a duration of the first predetermined period of time t1 is less than a duration of the display scanning signal output phase T1.

It should be noted that in the driving method provided by the present disclosure, the last stage of shift register unit of each shift register unit group enters the detection scanning signal output phase T2 after outputting the display scanning signal.

In the driving method provided by the present disclosure, no matter in the display scanning signal output phase or the detection scanning signal output phase, only the pull-down control sub-circuit in each shift register unit works, so that a failure of a thin film transistor caused by a long-term bias voltage can be avoided.

In the display scanning signal output phase T1 of each frame period, the display trigger signal STU2 is provided to the control terminal of the display input sub-circuit in the first stage of shift register unit, so that the input terminal of the display input sub-circuit and the output terminal of the display input sub-circuit can be electrically coupled to each other, and the pull-up control terminal Q of the pull-up sub-circuit is charged. At this time, the third clock signal terminal CLKD receives the invalid third clock signal, and thus, the shift register unit outputs the invalid third clock signal. Then, the signal at the control terminal of the display input sub-circuit jumps, the pull-up control terminal Q of the pull-up sub-circuit is in a floating state, and the pull-up sub-circuit couples the voltage of the control terminal thereof to a higher potential, so that the input terminal and the output terminal of the pull-up sub-circuit are kept to be electrically coupled to each other. At this time, the third clock signal received by the third clock signal terminal CLKD jumps to a valid third clock signal, so that the shift register unit outputs the valid third clock signal (i.e. display scanning signal), and the display scanning signal output by the signal output terminal of the first stage of shift register unit is used as an input to the input terminal of the second stage of shift register unit. After outputting of the first stage of shift register unit, the pull-down control circuit and the pull-down sub-circuit pull down the potential of the pull-up control terminal Q of the pull-up sub-circuit to the level of the second level signal terminal VGL1, and pull down the potential of the signal output terminal OUT<1> of the first stage of shift register unit to the level of the third level signal terminal VGL2. After the input terminal of the second stage of shift register unit in the same shift register unit group receives the signal output by the output terminal of the first stage of shift register unit, the second stage of shift register unit outputs a signal according to the same process as the first stage of shift register unit, and the rest stages of shift register units operate in the same manner until an output of the last stage of shift register unit is finished.

In the detection scanning signal output phase T2 of each frame period, only one stage of shift register unit outputs a detection scanning signal, in other words, only one row of pixel units is detected in each frame period.

In the implementation shown in FIG. 3, only the third clock signal terminal CLKD of the first stage of shift register unit is provided with the valid third clock signal during the detection scanning signal output phase T2 of the first frame period 1F, so that only the first stage of shift register unit outputs the detection scanning signal to detect only the first row of pixel units of the corresponding display panel during the first frame period 1F. In the detection scanning signal output phase T2 of the second frame period 2F, only the third clock signal terminal CLKD of the second stage of shift register unit is provided with the valid third clock signal, so that in the second frame period 2F, only the second stage of shift register unit outputs the detection scanning signal. Accordingly, in the third frame period 3F, only the third stage of shift register unit outputs the detection scanning signal, and in the fourth frame period 4F, only the fourth stage of shift register unit outputs the detection scanning signal, and so on.

In the present disclosure, the number of stages of shift register units that output the detection scanning signals in each frame period is not particularly limited, as long as each of the shift register units can output the detection scanning signal in predetermined number of frame periods.

In the present disclosure, the valid third clock signal output in the detection scanning signal output phase T2 lasts for the second predetermined period t2, as shown in FIG. 3, a duration of the second predetermined period t2 is less than a duration of the detection scanning signal output phase T2.

In some implementations, the driving method further includes providing a reset signal, and before the first frame period 1F, first resetting the detection input sub-circuit, that is, providing a valid detection reset signal to the detection reset signal terminal TRST1. In each frame period, before the detection scanning signal output phase T2 of the frame period ends, a valid noise reduction control signal is provided to the control terminal TRST2 of the noise reduction circuit of the display signal input sub-circuit to perform noise reduction and reset on the pull-up control terminal Q of the pull-up sub-circuit in each stage of shift register unit.

Figure 10:
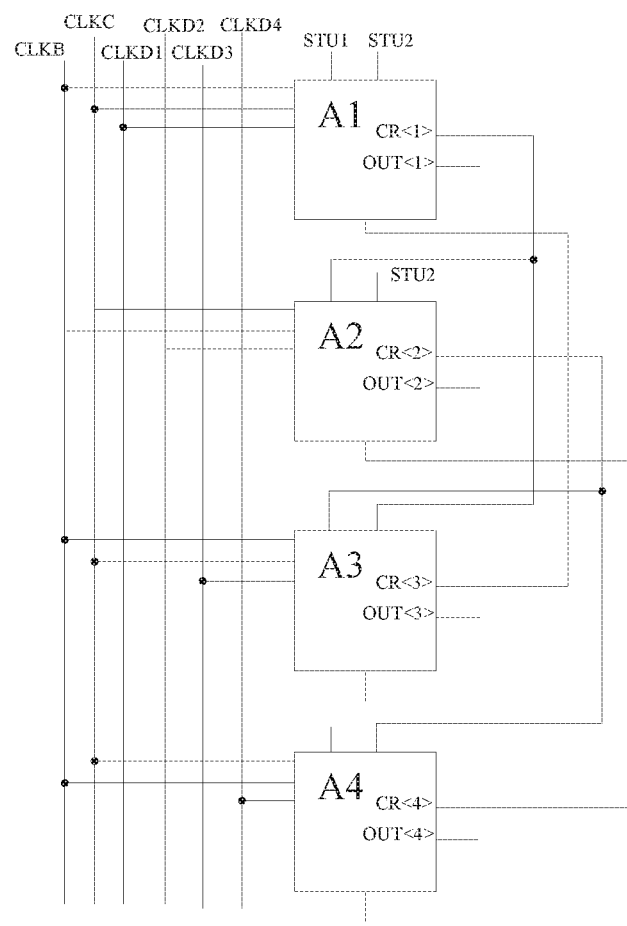
FIG. 10 is a partial schematic diagram of a gate driving circuit provided by the present disclosure.

The driving method provided by the present disclosure will be described with reference to FIGS. 2, 3 and 10.

As shown in FIG. 3, one period of the driving method is one frame of the display panel, which is shown as a first frame period 1F, a second frame period 2F, a third frame period 3F, and a fourth frame period 4F in FIG. 3. As shown in FIG. 10, the gate driving circuit includes two shift register unit groups, the odd-numbered stages of shift register units are in one shift register unit group, the even-numbered stages of shift register units are in one shift register unit group, and correspondingly, corresponding to the implementation in FIG. 10, the gate driving circuit includes four third clock signal lines, i.e., a third clock signal line CLKD1 and a third clock signal line CLKD3 for providing third clock signals to the shift register unit group including the odd-numbered stages of shift register units, and a third clock signal line CLKD2 and a third clock signal line CLKD4 for providing third clock signals to the shift register unit group including the even-numbered stages of shift register units.

In FIG. 3, H<1> represents a potential of the control terminal of the detection signal output sub-circuit in the first stage of shift register unit, H<2> represents a potential of the control terminal of the detection signal output sub-circuit in the second stage of shift register unit, H<3> represents a potential of the control terminal of the detection signal output sub-circuit in the third stage of shift register unit, and H<4> represents a potential of the control terminal of the detection signal output sub-circuit in the fourth stage of shift register unit.

Each frame period of the driving method includes the display scanning signal output phase T1 and the detection scanning signal output phase T2.

In the first frame period F1, the display trigger signal STU2 is provided to the control terminal of the display signal input sub-circuit in the first stage of shift register unit, the detection trigger signal STU1 is provided to the input terminal of the detection signal input sub-circuit in the first stage of shift register unit, an invalid fourth clock signal (i.e., a low level signal) is provided to the fourth clock signal terminal CLKN, a valid fourth clock signal (i.e., a high level signal) is provided to the fourth clock signal terminal CLKM, a valid first clock signal is provided to the first clock signal terminal CLKB, and accordingly, an invalid third clock signal is provided to each of the third clock signal terminals.

After receiving the detection trigger signal STU1, the first stage of shift register unit goes through a charging phase, an output phase, and a pull-down phase. In the charging phase, when the first control terminal of the detection signal input sub-circuit 110 receives a valid first clock signal, the detection signal input sub-circuit 110 receives and stores the detection trigger signal input through the input terminal of the detection signal input sub-circuit 110, and the second control terminal of the detection signal input sub-circuit 110 receives an invalid second clock signal, so that the input terminal of the detection signal input sub-circuit and the output terminal of the detection signal input sub-circuit are electrically decoupled from each other, when the control terminal of the display signal input sub-circuit receives the display trigger signal STU2, the input terminal of the display signal input sub-circuit and the output terminal of the display signal input sub-circuit are electrically coupled to each other to transmit the display scanning signal input through the first level signal terminal VDD to the control terminal of the pull-up sub-circuit, the input terminal and the output terminal of the pull-up sub-circuit are electrically coupled to each other, since the signal provided by the third clock signal terminal is an invalid signal at this time, each signal output terminal also outputs an invalid signal (i.e., OUT<1>, OUT<2>, OUT<3>, and OUT<4> in FIG. 3 all output invalid signals). Corresponding to the implementation in FIG. 2, the detection signal input transistor M1 is turned on, the second reset transistor M2 and the switching transistor M4 are turned off, and the detection scanning trigger signal input through the detection signal input transistor M1 is written to the first storage sub-circuit C1. At the same time, the display signal input transistor M5 (i.e., the display signal input sub-circuit 120) is turned on, and the display scanning control signal input through the input terminal of the display signal input sub-circuit is written into the pull-up control terminal Q of the pull-up sub-circuit 131, so that both the pull-up transistor M15 and the pull-up transistor M17 are turned on, and since the signal input through the third clock signal terminal is a low level signal, the signal output terminal also outputs a low level signal at this time.

In the output phase, a third clock signal is provided to four third clock signal lines, wherein the third clock signal is a square wave signal, in two adjacent stages of shift register units, the third clock signal received by the next stage of shift register unit is delayed by a predetermined time than the third clock signal received by the previous stage of shift register unit, an invalid first clock signal is provided to the first clock signal terminal CLKB, and an invalid second clock signal is provided to the second clock signal terminal CLKC, and potentials at control terminals of pull-up sub-circuits in stages of shift register units (the control terminal Q<1> of the first stage of shift register unit and the control terminal Q<2> of the second stage of shift register unit shown in FIG. 3) are sequentially coupled to a higher potential, so that the input terminal and the output terminal of the corresponding pull-up sub-circuit are electrically coupled to each other, and an output is performed. Corresponding to the implementation shown in FIG. 2, the storage capacitor C2 couples the control terminal of the pull-up sub-circuit 131 to a higher potential, so that the pull-up transistor M15 and the pull-up transistor M17 are both turned on, and the valid signal is input to the third clock signal terminal CLKD, therefore, the signal output from the signal output terminal is the valid third clock signal.

In the pull-down stage, an invalid third clock signal is provided to the corresponding third clock signal terminal, and by the pull-down control circuit, the input terminal and the output terminal of the pull-down sub-circuit can be electrically coupled to each other, and the input terminal of the pull-down control circuit and the control terminal of the pull-up sub-circuit can be electrically coupled to each other, so that the control terminal and the signal output terminal of the pull-up sub-circuit can be pulled down. Corresponding to the implementation shown in FIG. 3, during the pull-down stage, the signal input from the third clock signal terminal CLKD is an invalid signal, at this time, the second pull-down control transistor M9 is turned on to pull down the potential of the pull-up control terminal Q of the pull-up sub-circuit to the low level input through the second level signal terminal VGL1, the signal input through the first pull-down control transistor M8 makes the pull-down control terminal QB_1 of the pull-down sub-circuit have a high level signal, therefore, the input terminal and the output terminal of the pull-down sub-circuit are electrically coupled to each other, so that the pull-down transistors M16 and M18 can be turned on to pull down the potential of the signal output terminal to the low level signal input through the third level signal terminal VGL2, and the pull-down control terminal QB_2 of the pull-down sub-circuit is in the floating state.

The signal output by the first stage of shift register unit can be used as a trigger signal of the display signal input sub-circuit in the third stage of shift register unit.

The signal output by the second stage of shift register unit can be used as a trigger signal of the display signal input sub-circuit in the fourth stage of shift register units.

For each of other stages of shift register units, after receiving a valid display trigger signal, all transistors therein operate the same as those in the first stage of shift register unit, which will be not described in detail herein.

In an implementation provided by the present disclosure, the first stage of shift register unit and the second stage of shift register unit share the display trigger signal STU2.

During outputting of the display scanning signal, the switch transistor M4 is always turned off. An influence of the detection trigger signal stored in the first storage sub-circuit C1 on displaying is avoided.

After all the odd-numbered stages of shift register units complete outputting display scanning signals, the detection scanning signal output phase is entered. At this time, the second clock signal terminal CLKC of the first stage of shift register unit receives the valid second clock signal, the signal stored in the first storage sub-circuit C1 is output to the control terminal of the pull-up sub-circuit, and the storage capacitor C2 is charged, and at the same time, the valid third clock signal is provided to the third clock signal terminal of the first stage of shift register unit, so that the input terminal and the output terminal of the pull-up sub-circuit are electrically coupled to each other, and the first stage of shift register unit outputs the detection scanning signal.

Similarly, after all the even-numbered stages of shift register units complete outputting display scanning signals, the detection scanning signal output phase T2 is entered. The process is similar to that of the odd-numbered stages of shift register units in the detection scanning signal output phase, and thus is not described herein again.

Before each frame period is ended, a valid signal is provided to the control terminal TRST2 of the noise reduction circuit of the shift register unit, so that the control terminal of the pull-up sub-circuit can be reset, thereby facilitating a continuation of the next frame period.

In the present disclosure, proportions for superposition of output waveforms are accomplished by adjusting a pulse width of the third clock signal and a pulse width of the input signal.

In the present disclosure, the first level signal terminal VDD may provide a high level signal, the second level signal terminal VGL1 and the third level signal terminal VGL2 may provide a low level signal, and the low level signals provided by the second level signal terminal VGL1 and the third level signal terminal VGL2 may be the same as or different from each other, e.g., the potential of the low level signal provided by the second level signal terminal VGL1 may be lower than the potential of the low level signal provided by the third level signal terminal VGL2.

It will be understood that the above implementations are merely exemplary implementations employed to illustrate the principle of the present disclosure, and the present disclosure is not limited thereto. It will be apparent to those skilled in the art that various changes and modifications may be made therein without departing from the spirit and scope of the present disclosure, and these changes and modifications are to be considered within the scope of the present disclosure.

The invention claimed is:

1. A shift register unit, comprising a signal input circuit, an output circuit, a pull-down control circuit and a signal output terminal, wherein the output circuit comprises a pull-up sub-circuit and a pull-down sub-circuit, the signal input circuit is configured to provide signals to a pull-up control terminal of the pull-up sub-circuit at different time periods;

the pull-up sub-circuit is configured to output a scanning signal via the signal output terminal under control of a signal received by the pull-up control terminal of the pull-up sub-circuit;

the pull-down sub-circuit comprises a plurality of pull-down control terminals, and is configured to pull down a potential of the signal output terminal under control of a valid pull-down control signal received by at least one of the pull-down control terminals of the pull-down sub-circuit;

the pull-down control circuit comprises a selection sub-circuit and a plurality of pull-down control sub-circuits, the pull-down control sub-circuits correspond to the pull-down control terminals in a one-to-one mode, and the selection sub-circuit is configured to selectively configure one of the pull-down control sub-circuits to provide the valid pull-down control signal to a corresponding one of the pull-down control terminals, wherein the signal input circuit comprises a detection signal input sub-circuit and a display signal input sub-circuit, the detection signal input sub-circuit is configured to provide a detection scanning control signal to the pull-up control terminal of the pull-up sub-circuit in a detection scanning signal output phase;

the display signal input sub-circuit is configured to provide a display scanning control signal to the pull-up control terminal of the pull-up sub-circuit in a display scanning output phase, wherein the detection signal input sub-circuit comprises a detection trigger signal input sub-circuit, a detection signal output sub-circuit, a switch sub-circuit, a detection signal reset sub-circuit, and a first storage sub-circuit, an output terminal of the detection trigger signal input sub-circuit is electrically coupled to a control terminal of the detection signal output sub-circuit, an input terminal of the detection trigger signal input sub-circuit is formed as an input terminal of the detection signal input sub-circuit, and the detection trigger signal input sub-circuit is configured to control the input terminal of the detection trigger signal input sub-circuit to be electrically coupled to or decoupled from the output terminal of the detection trigger signal input sub-circuit according to a signal received by a control terminal of the detection trigger signal input sub-circuit;

an input terminal of the detection signal output sub-circuit is electrically coupled to a second clock signal terminal, an output terminal of the detection signal output sub-circuit is electrically coupled to an input terminal of the switch sub-circuit, and the detection signal output sub-circuit is configured to control the input terminal of the detection signal output sub-circuit to be electrically coupled to or decoupled from the output terminal of the detection signal output sub-circuit according to a signal received by the control terminal of the detection signal output sub-circuit;

an output terminal of the switch sub-circuit is electrically coupled to the pull-up control terminal of the pull-up sub-circuit, and the switch sub-circuit is configured to control the input terminal of the switch sub-circuit to be electrically coupled to or decoupled from the output terminal of the switch sub-circuit according to a signal received by a control terminal of the switch sub-circuit;

an input terminal of the detection signal reset sub-circuit is electrically coupled to a second level signal terminal, an output terminal of the detection signal reset sub-circuit is electrically coupled to the control terminal of the detection signal output sub-circuit, a control terminal of the detection signal reset sub-circuit is electrically coupled to a detection reset signal terminal, and the detection signal reset sub-circuit is configured to control the input terminal of the detection signal reset sub-circuit to be electrically coupled to or decoupled from the output terminal of the detection signal reset sub-circuit according to a signal received by the control terminal of the detection signal reset sub-circuit; and a first terminal of the first storage sub-circuit is electrically coupled to the control terminal of the detection signal output sub-circuit, and a second terminal of the first storage sub-circuit is electrically coupled to the second level signal terminal, wherein the detection trigger signal input sub-circuit comprises a detection signal input transistor and a fifth anti-leakage transistor, a gate electrode of the detection signal input transistor is electrically coupled to a first clock signal terminal, a first electrode of the detection signal input transistor is formed as the input terminal of the detection signal input sub-circuit, and a second electrode of the detection signal input transistor is electrically coupled to a first electrode of the fifth anti-leakage transistor, a gate electrode of the fifth anti-leakage transistor is electrically coupled to the gate electrode of the detection signal input transistor, and a second electrode of the fifth anti-leakage transistor is electrically coupled to the control terminal of the detection signal output sub-circuit and the input terminal of the detection signal reset sub-circuit;

wherein the detection signal reset sub-circuit comprises a second reset transistor and a sixth anti-leakage transistor, wherein a first electrode of the second reset transistor is electrically coupled to the output terminal of the detection signal input sub-circuit, a second electrode of the second reset transistor is electrically coupled to a first electrode of the sixth anti-leakage transistor, and a gate electrode of the second reset transistor is formed as the control terminal of the detection signal reset sub-circuit, a gate electrode of the sixth anti-leakage transistor is electrically coupled to the gate electrode of the second reset transistor, and a second electrode of the sixth anti-leakage transistor is electrically coupled to the second level signal terminal, wherein the switch sub-circuit comprises a switch transistor and a seventh anti-leakage transistor, a gate electrode of the switch transistor is formed as the control terminal of the switch sub-circuit, a first electrode of the switch transistor is formed as the input terminal of the switch sub-circuit, and a second electrode of the switch transistor is electrically coupled to a first electrode of the seventh anti-leakage transistor, a gate electrode of the seventh anti-leakage transistor is electrically coupled to the gate electrode of the switch transistor, and a second electrode of the seventh anti-leakage transistor is electrically coupled to the control terminal of the pull-up sub-circuit;

the shift register unit further comprises an eighth anti-leakage transistor, a gate electrode of the eighth anti-leakage transistor is electrically coupled to the output terminal of the detection signal input sub-circuit, a first electrode of the eighth anti-leakage transistor is electrically coupled to the second electrode of the detection input transistor, and a second electrode of the eighth anti-leakage transistor is electrically coupled to an input terminal of the display signal input sub-circuit.

2. The shift register unit according to claim 1, wherein the pull-down sub-circuit comprises two pull-down control terminals, the pull-down control circuit comprises a first pull-down control sub-circuit and a second pull-down control sub-circuit, the selection sub-circuit comprises a selection transistor, and a gate electrode of the selection transistor is electrically coupled to a fifth clock signal terminal;

the first pull-down control sub-circuit comprises a first pull-down control transistor, a second pull-down control transistor and a third pull-down control transistor, wherein a gate electrode and a first electrode of the first pull-down control transistor are electrically coupled to a corresponding fourth clock signal terminal, a second electrode of the first pull-down control transistor is electrically coupled to a first electrode of the third pull-down control transistor and one of the two pull-down control terminals of the pull-down sub-circuit, a gate electrode of the second pull-down control transistor is electrically coupled to the second electrode of the first pull-down control transistor, a second electrode of the second pull-down control transistor is indirectly electrically coupled to a second level signal terminal, a first electrode of the second pull-down control transistor is electrically coupled to the pull-up control terminal of the pull-up sub-circuit, and a second electrode of the third pull-down control transistor is electrically coupled to the second level signal terminal, a gate electrode of the third pull-down control transistor is electrically coupled to the pull-up control terminal of the pull-up sub-circuit;

the second pull-down control sub-circuit comprises a fourth pull-down control transistor, a fifth pull-down control transistor and a sixth pull-down control transistor, a gate electrode and a first electrode of the fourth pull-down control transistor are electrically coupled to a corresponding fourth clock signal terminal, a second electrode of the fourth pull-down control transistor is electrically coupled to a first electrode of the sixth pull-down control transistor and the other one of the two pull-down control terminals of the pull-down sub-circuit, a gate electrode of the fifth pull-down control transistor is electrically coupled to the second electrode of the fourth pull-down control transistor, a second electrode of the fifth pull-down control transistor is indirectly electrically coupled to the second level signal terminal, a first electrode of the fifth pull-down control transistor is electrically coupled to the pull-up control terminal of the pull-up sub-circuit, and a second electrode of the sixth pull-down control transistor is electrically coupled to the second level signal terminal, a gate electrode of the sixth pull-down control transistor is electrically coupled to the control terminal of the pull-up sub-circuit; a second electrode of the selection transistor is electrically coupled; directly to the second electrode of the first pull-down control transistor, and a first electrode of the selection transistor is electrically coupled directly to the second electrode of the fourth pull-down control transistor.

3. The shift register unit according to claim 2, wherein the selection sub-circuit further comprises a first anti-interference transistor and a second anti-interference transistor, the second electrode of the selection transistor is electrically coupled to the second electrode of the first pull-down control transistor through the first anti-interference transistor, and the first electrode of the selection transistor is electrically coupled to the second electrode of the fourth pull-down control transistor through the second anti-interference transistor;

a gate electrode of the first anti-interference transistor and a second electrode of the first anti-interference transistor are electrically coupled to the second electrode of the first pull-down control transistor, and a first electrode of the first anti-interference transistor is electrically coupled to the second electrode of the selection transistor;

a gate electrode of the second anti-interference transistor and a second electrode of the second anti-interference transistor are electrically coupled to the first electrode of the selection transistor, and a first electrode of the second anti-interference transistor is electrically coupled to the second electrode of the fourth pull-down control transistor.

4. The shift register unit according to claim 2, wherein the first pull-down control sub-circuit further comprises a first anti-leakage transistor having a gate electrode electrically coupled to the gate electrode of the second pull-down control transistor, a first electrode electrically coupled to the second electrode of the second pull-down control transistor, and a second electrode electrically coupled to the second level signal terminal;

the second pull-down control sub-circuit further comprises a second anti-leakage transistor, a gate electrode of the second anti-leakage transistor is electrically coupled to the gate electrode of the fifth pull-down control transistor, the second electrode of the fifth pull-down control transistor is electrically coupled to a first electrode of the second anti-leakage transistor, and a second electrode of the second anti-leakage transistor is electrically coupled to the second level signal terminal.

5. The shift register unit according to claim 1, further comprising a reset circuit, wherein an input terminal of the reset circuit is electrically coupled to the second level signal terminal, an output terminal of the reset circuit is electrically coupled to the pull-up control terminal of the pull-up sub-circuit, a control terminal of the reset circuit is electrically coupled to a first reset signal terminal, and the reset circuit is configured to control the input terminal of the reset circuit to be electrically coupled to or decoupled from the output terminal of the reset circuit according to a signal provided by the first reset signal terminal.

6. The shift register unit according to claim 5, wherein the reset circuit comprises a first reset transistor, a second electrode of the first reset transistor is electrically coupled to the second level signal terminal, and a first electrode of the first reset transistor is electrically coupled to the pull-up control terminal of the pull-up sub-circuit, wherein the reset circuit further comprises a third anti-leakage transistor, a gate electrode of the third anti-leakage transistor is electrically coupled to a gate electrode of the first reset transistor, a first electrode of the third anti-leakage transistor is electrically coupled to the second electrode of the first reset transistor, and a second electrode of the third anti-leakage transistor is electrically coupled to the second level signal terminal.

7. The shift register unit according to claim 1, further comprising a noise reduction circuit, wherein an input terminal of the noise reduction circuit is electrically coupled to the second level signal terminal, an output terminal of the noise reduction circuit is electrically coupled to the pull-up control terminal of the pull-up sub-circuit, a control terminal of the noise reduction circuit is electrically coupled to a noise reduction signal terminal, and the noise reduction circuit is configured to control the input terminal of the noise reduction circuit to be electrically coupled to or decoupled from the output terminal of the noise reduction circuit according to a signal received by the control terminal of the noise reduction circuit.

8. The shift register unit according to claim 7, wherein the noise reduction circuit comprises a noise reduction transistor and a fourth anti-leakage transistor, a second electrode of the noise reduction transistor is electrically coupled to a first electrode of the fourth anti-leakage transistor, and a first electrode of the noise reduction transistor is electrically coupled to the control terminal of the pull-up sub-circuit, a gate electrode of the fourth anti-leakage transistor is electrically coupled to a gate electrode of the noise reduction transistor, and a second electrode of the fourth anti-leakage transistor is electrically coupled to the second level signal terminal.

9. The shift register unit according to claim 1, further comprising a noise reduction circuit, wherein the noise reduction circuit comprises a noise reduction transistor and a fourth anti-leakage transistor, a first electrode of the fourth anti-leakage transistor is electrically coupled to a second electrode of the noise reduction transistor, a second electrode of the fourth anti-leakage transistor is electrically coupled to the second level signal terminal, and a first electrode of the noise reduction transistor is electrically coupled to the control terminal of the pull-up sub-circuit;

the shift register unit further comprises a ninth anti-leakage transistor, a gate electrode of the ninth anti-leakage transistor is electrically coupled to the control terminal of the pull-up sub-circuit, a first electrode of the ninth anti-leakage transistor is electrically coupled to the input terminal of the display signal input sub-circuit, and a second electrode of the ninth anti-leakage transistor is electrically coupled to the output terminal of the noise reduction circuit.

10. The shift register unit according to claim 1, wherein the pull-up sub-circuit comprises a cascade pull-up sub-circuit and a scanning signal output pull-up sub-circuit, wherein a control terminal of the cascade pull-up sub-circuit is electrically coupled to a control terminal of the scanning signal output pull-up sub-circuit and is formed as the control terminal of the pull-up sub-circuit;

the signal output terminal comprises a cascade signal output terminal of the cascade output sub-circuit and a scanning signal output terminal of the scanning signal output sub-circuit;

the pull-down sub-circuit comprises a cascade pull-down sub-circuit and a scanning signal output pull-down sub-circuit, wherein a control terminal of the cascade pull-down sub-circuit is electrically coupled to a control terminal of the scanning signal output pull-down sub-circuit and is formed as the control terminal of the pull-down sub-circuit;

an output terminal of the scanning signal output pull-up sub-circuit is electrically coupled to the corresponding scanning signal output terminal, an output terminal of the scanning signal output pull-down sub-circuit is electrically coupled to the corresponding scanning signal output terminal, an output terminal of the cascade pull-down sub-circuit is electrically coupled to the cascade signal output terminal, and an output terminal of the cascade pull-up sub-circuit is electrically coupled to the cascade signal output terminal.

11. The shift register unit according to claim 10, wherein the cascade pull-up sub-circuit comprises a cascade pull-up transistor and a storage capacitor, each scanning signal output pull-up sub-circuit comprises a scanning signal output pull-up transistor, a gate electrode of the cascade pull-up transistor is formed as the pull-up control terminal of the pull-up sub-circuit, a first electrode of the cascade pull-up transistor is formed as an input terminal of the cascade pull-up sub-circuit, a second electrode of the cascade pull-up transistor is formed as the output terminal of the cascade pull-up sub-circuit, one terminal of the storage capacitor is electrically coupled to the gate electrode of the cascade pull-up transistor, and the other terminal of the storage capacitor is electrically coupled to the second electrode of the cascade pull-up transistor; and
- a gate electrode of the scanning signal output pull-up transistor is electrically coupled to the gate electrode of the cascade pull-up transistor, a first electrode of the scanning signal output pull-up transistor is formed as an input terminal of the scanning signal output pull-up sub-circuit, and a second electrode of the scanning signal output pull-up transistor is formed as the output terminal of the scanning signal output pull-up sub-circuit,
- wherein the cascade pull-down sub-circuit comprises a plurality of cascade pull-down transistors, and the number of the cascade pull-down transistors is the same as the number of the control terminals of the pull-down sub-circuit and the cascade pull-down transistors correspond to the control terminals of the pull-down sub-circuit in a one-to-one mode, the scanning signal output pull-down sub-circuit comprises a plurality of scanning signal output pull-down transistors, and the number of the scanning signal pull-down output transistors is the same as the number of the control terminals of the pull-down sub-circuit and the scanning signal pull-down output transistors correspond to the control terminals of the pull-down sub-circuit in a one-to-one mode;
- gate electrodes of the cascade pull-down transistors are respectively formed as the pull-down control terminals of the pull-down sub-circuit, first electrodes of the cascade pull-down transistors are formed as the input terminal of the cascade pull-down sub-circuit, and second electrodes of the cascade pull-down transistors are formed as the output terminal of the cascade pull-down sub-circuit;
- gate electrodes of the scanning signal output pull-down transistors are respectively electrically coupled to corresponding pull-down control terminals of the pull-down sub-circuits, first electrodes of the scanning signal output pull-down transistors are formed as the input terminal of the scanning signal pull-down output sub-circuit, and second electrodes of the scanning signal output pull-down transistors are formed as the output terminal of the scanning signal pull-down output sub-circuit.

12. A gate driving circuit, comprising at least one shift register unit group, each shift register unit group comprising a plurality of shift register units that are cascaded, at least one of the shift register units being as claimed in claim 1.

13. The gate driving circuit according to claim 12, comprising M shift register unit groups, wherein the first M stages of shift register units of the gate driving circuit are respectively shift register units at a first stage of the M shift register unit groups, and the $n^{th}$ stage of shift register unit is cascaded with the $(n-M)^{th}$ stage of shift register unit, wherein M is a constant value and is a natural number not less than 1, n is a variable, and n is a natural number not less than M.

14. A display panel, comprising the gate driver circuit as claimed in claim 12, the signal input circuit of the shift register unit of the gate driving circuit comprising a detection signal input sub-circuit and a display signal input sub-circuit, in a single stage of shift register unit,
- the output terminal of the detection signal input sub-circuit is electrically coupled to the control terminal of the pull-up sub-circuit, the first control terminal of the detection signal input sub-circuit is electrically coupled to the first clock signal terminal, and the second control terminal of the detection signal input sub-circuit is electrically coupled to the second clock signal terminal, so that the detection signal input sub-circuit provides a detection scanning control signal to the control terminal of the pull-up sub-circuit under control of a first clock signal input by the first clock signal terminal and a second clock signal input by the second clock signal input terminal;
- the output terminal of the display signal input sub-circuit is electrically coupled to the control terminal of the pull-up sub-circuit, the input terminal of the display signal input sub-circuit is electrically coupled to a first level signal terminal, and the output terminal of the display signal input sub-circuit provides a display scanning control signal to the control terminal of the pull-up sub-circuit under control of a signal received by a control terminal of the display signal input sub-circuit.

15. A driving method for driving a display panel, the display panel comprises a gate driver circuit, the gate driver circuit comprises at least one shift register unit group, each shift register unit group comprises a plurality of shift register units that are cascaded, at least one of the shift register units comprises a signal input circuit, an output circuit, a pull-down control circuit and a signal output terminal, wherein the output circuit comprises a pull-up sub-circuit and pull-down sub-circuit,
- the signal input circuit is configured to provide signals to a pull-up control terminal of the pull-up sub circuit at different time periods;
- the pull-up sub-circuit is configured to output a scanning signal via the signal output terminal under control of a signal received by the pull-up control terminal of the pull-up sub-circuit;
- the pull-down sub-circuit comprises a plurality of pull down control terminals, and is configured to pull down a potential of the signal output terminal under control of a valid pull-down control signal received by at least one of the pulldown control terminals of the poll-down sub-circuit;
- the pull-down control circuit comprises a selection sub-circuit and a plurality of pull-down control sub-circuits, the pull-down control sub-circuits correspond to the pull-down control terminals in a one-to-one mode, and the selection sub-circuit is configured to selectively configure one of the pull-down control sub-circuits to provide the valid pull-down control signal to a corresponding one of the pull-down control terminals;
- the signal input circuit of the shift register unit of the gate driving circuit comprising a detection signal input sub-circuit and a display signal input sub-circuit, in a single stage of shift register unit,
- an output terminal of detection signal input sub-circuit is electrically coupled to the control terminal of the pull-up sub-circuit, a first control terminal of the detection signal input sub-circuit is electrically coupled to a first clock signal terminal, and a second control terminal of the detection signal input sub-circuit is electrically coupled to a second dock signal terminal, so that the detection signal input sub-circuit provides a detection scan nine control signal to the control terminal of the pull-up sub circuit under control of a first dock signal input by the first clock signal terminal and a second clock signal input by the second dock signal input terminal;

an output terminal oi the display signal input sub-circuit is electrically coupled to the control terminal of the pull-up sub-circuit, an input terminal of the display signal input sub-circuit is electrically coupled to a first level signal terminal, and the output terminal of the display signal input sub-circuit provides a display scanning control signal to the control terminal of the pull-up sub-circuit under control of a signal received by a control terminal of the display signal input sub-circuit, the detection signal input sub-circuit is configured to provide a detection scanning control signal to the pull-up control terminal of the pull-up sub-circuit in a detection scanning signal output phase, the display signal input sub-circuit is configured to provide a display scanning control signal to the pull-up control terminal of the pull-up sub-circuit in a display scanning output phase, wherein the detection signal input sub-circuit comprises a detection trigger signal input sub-circuit, a detection signal output sub-circuit, a switch sub-circuit, a detection signal reset sub-circuit, and a first storage sub-circuit, an output terminal of the detection trigger signal input sub-circuit is electrically coupled to a control terminal of the detection signal output sub-circuit, an input terminal of the detection trigger signal input sub-circuit is formed as art input terminal of the detection signal input sub-circuit, and the detection trigger signal input sub-circuit is configured to control the input terminal of the detection trigger signal input sub-circuit to be electrically coupled to or decoupled from the output terminal of the detection trigger signal input sub-circuit according to a signal received by a control terminal of the detection trigger signal input sub-circuit, an input terminal of the detection signal output sub-circuit is electrically coupled to a second clock signal terminal, an output terminal of the detection signal output sub-circuit is electrically coupled to an input terminal of the switch sub-circuit, and the detection signal output sub-circuit is eon figured to control the input terminal ok the detection signal output sub-circuit to be electrically coupled to or decoupled from the output terminal of the detection signal output sub-circuit according to a signal received by the control terminal of the detection signal output sub-circuit;

an output terminal of the switch sub-circuit is electrically coupled to the pull-up control terminal of the pull-up sub-circuit, and the switch sub-circuit is configured to control the input terminal of the switch sub-circuit to be electrically coupled to or decoupled from the output terminal of the switch sub-circuit according to a signal received by a control terminal of the switch sub-circuit;

an input terminal of the detection signal reset sub-circuit is electrically coupled to a second level signal terminal, an output terminal of the detection signal reset sub-circuit is electrically coupled to the control terminal of the detection signal output sub-circuit, a control terminal of the detection signal reset sub-circuit is electrically coupled to a detection reset signal terminal, and the detection signal reset sub-circuit is configured to control the input terminal of the detection signal reset sub-circuit to be electrically coupled to or decoupled from the output terminal of the detection signal reset sub-circuit according to a signal received by the control terminal of the detection signal reset sub-circuit; and a first terminal of the first storage sub-circuit is electrically coupled to the control terminal of the detection signal output sub-circuit, and a second terminal of the first storage sub-circuit is electrically coupled to the second level signal terminal, wherein the detection trigger signal input sub-circuit comprise a detection signal input transistor and a fifth anti-leakage transistor, a gate electrode of the detection signal input transistor is electrically coupled to a first clock signal terminal, a first electrode of the detection signal input electrode of the detection signal input transistor is electrically coupled to a first electrode oi the fifth anti-leakage transistor, a gate electrode of the fifth anti-leakage transistor is electrically coupled to the gate electrode of the detection signal input transistor, and a second electrode of the fifth anti-leakage transistor is electrically coupled to the control terminal oi the detection signal output sub-circuit and the input terminal of the detection signal reset sub-circuit;

wherein the detection signal reset sub-circuit comprises a second reset transistor and a sixth anti-leakage transistor, wherein a first electrode of the second react transistor is electrically coupled to the output terminal of the detection signal input sub-circuit, a second electrode of the second reset transistor is electrically coupled to a firm electrode of the sixth anti-leakage transistor, and a gate electrode of the second reset transistor is formed as the control terminal of the detection signal reset sub-circuit, a gate electrode of the sixth anti-leakage transistor is electrically coupled to the gate electrode of the second reset transistor, and a second electrode of the sixth anti-leakage transistor is electrically coupled to the second level signal terminal, wherein the switch sub-circuit comprises a switch transistor and a seventh anti-leakage transistor, a gate electrode of the switch transistor is formed as the control terminal of the switch sub-circuit, a first electrode of the switch transistor is formed as the input terminal of the switch sub-circuit, and a second electrode of the switch transistor is electrically coupled to a first electrode of the seventh anti-leakage transistor, a gate electrode of the seventh anti-leakage transistor is electrically coupled to the gale electrode of the switch transistor, and a second electrode of the seventh anti-leakage transistor is electrically coupled to the control terminal of the pull-up sub-circuit, the shift register unit further comprises an eighth anti-leakage transistor, a gate electrode of the eighth anti-leakage transistor is electrically coupled to the output terminal of the detection signal input sub-circuit, a first electrode of the eighth anti-leakage transistor is electrically coupled to the second electrode of the detection input transistor, and a second electrode of the eighth anti-leakage transistor is electrically coupled to an input terminal of the display signal input sub-circuit, the driving method comprises a plurality of frame periods each comprising a display scanning signal output phase and a detection scanning signal output phase, the driving method comprising:

controlling one of the pull-down control sub-circuits through the selection sub-circuit to provide a signal to a pull-down control terminal of the pull-down sub-circuit;

in the display scanning signal output phase of each frame period, providing a display trigger signal to the control terminal of the display signal input sub-circuit in a first stage of shift register unit of each shift register unit group, so as to provide a signal to the pull-up control terminal of the pull-up sub-circuit by using the display signal input sub-circuit;

in the display scanning signal output phase of a first frame period, providing a detection initial signal to an input terminal of the detection signal input sub-circuit in the first stage of shift register unit of each shift register unit group, so as to provide a signal to the pull-up control terminal of the pull-up sub-circuit by using the detection signal input sub-circuit, and in different frame periods, respectively controlling detection signal input sub-circuits in different stages of shift register units to output, so that in a predetermined number of frame periods, each of the shift register units outputs a valid signal to the pull-up control terminal of the pull-up sub-circuit in the detection scanning signal output phase.

\* \* \* \* \*